United States Patent
Lee

(10) Patent No.: US 9,076,757 B2
(45) Date of Patent: Jul. 7, 2015

(54) METHODS OF FORMING A PLURALITY OF CAPACITORS

(71) Applicant: Micron Technology, Inc., Boise, ID (US)

(72) Inventor: Che-Chi Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/964,947

(22) Filed: Aug. 12, 2013

(65) Prior Publication Data

US 2013/0323902 A1 Dec. 5, 2013

Related U.S. Application Data

(63) Continuation of application No. 12/854,446, filed on Aug. 11, 2010, now Pat. No. 8,518,788.

(51) Int. Cl.
*H01L 49/02* (2006.01)
*H01L 27/108* (2006.01)
*H01L 27/02* (2006.01)

(52) U.S. Cl.
CPC .......... *H01L 28/40* (2013.01); *H01L 27/10817* (2013.01); *H01L 27/10894* (2013.01);
(Continued)

(58) Field of Classification Search
CPC ... H01L 28/87; H01L 28/91; H01L 27/10817; H01L 27/10894; H01L 27/10897
USPC ........................................................ 438/397
See application file for complete search history.

(56) References Cited

U.S. PATENT DOCUMENTS

| 4,517,729 A | 5/1985 | Batra |
| 4,871,688 A | 10/1989 | Lowrey |

(Continued)

FOREIGN PATENT DOCUMENTS

| CN | 1230778 | 10/1999 |
| CN | 101154620 | 4/2008 |

(Continued)

OTHER PUBLICATIONS

"Conductive Polymer" Wikipedia http://en/wikipedia.org/w/index.php?title—Conductive_polymer&printable=yes; Jun. 2004; 9 pp.

(Continued)

*Primary Examiner* — Mary Wilczewski
*Assistant Examiner* — Toniae Thomas
(74) *Attorney, Agent, or Firm* — Wells St. John, P.S.

(57) ABSTRACT

A method of forming a plurality of capacitors includes providing a plurality of capacitor electrodes, an elevationally inner insulative retaining material received laterally about the capacitor electrodes, an elevationally outer insulative retaining material received laterally about the capacitor electrodes, a first material received laterally about the capacitor electrodes elevationally inward of the inner insulative retaining material, and a second material received laterally about the capacitor electrodes elevationally between the inner and outer insulative retaining materials. Openings are anisotropically etched to extend through the outer insulative retaining material and the second material. After the anisotropic etching, remaining of the second material is isotropically etched through the openings from being received laterally about the capacitor electrodes between the inner and outer insulative retaining materials. The isotropic etching of the second material is conducted selectively relative to the capacitor electrodes and the inner and outer insulative retaining materials. The capacitor electrodes are ultimately incorporated into a plurality of capacitors.

31 Claims, 19 Drawing Sheets

(52) U.S. Cl.
CPC ............... *H01L28/87* (2013.01); *H01L 28/88* (2013.01); *H01L 27/10897* (2013.01); *H01L 27/0207* (2013.01); *H01L 27/10852* (2013.01); *H01L 28/92* (2013.01)

(56) References Cited

U.S. PATENT DOCUMENTS

| | | | | |
|---|---|---|---|---|
| 5,053,351 A * | 10/1991 | Fazan et al. | | 438/397 |
| 5,155,657 A * | 10/1992 | Oehrlein et al. | | 438/397 |
| 5,236,860 A | 8/1993 | Fazan et al. | | |
| 5,252,517 A | 10/1993 | Blalock et al. | | |
| 5,340,763 A | 8/1994 | Dennison | | |
| 5,401,681 A | 3/1995 | Dennison | | |
| 5,467,305 A | 11/1995 | Bertin et al. | | |
| 5,498,562 A | 3/1996 | Dennison et al. | | |
| 5,532,089 A | 7/1996 | Adair et al. | | |
| 5,571,742 A * | 11/1996 | Jeong | | 438/397 |
| 5,604,696 A | 2/1997 | Takaishi | | |
| 5,605,857 A | 2/1997 | Jost et al. | | |
| 5,652,164 A | 7/1997 | Dennison et al. | | |
| 5,654,222 A | 8/1997 | Sandhu et al. | | |
| 5,672,534 A | 9/1997 | Huang | | |
| 5,686,747 A | 11/1997 | Jost et al. | | |
| 5,702,990 A | 12/1997 | Jost et al. | | |
| 5,705,838 A | 1/1998 | Jost et al. | | |
| 5,767,561 A | 6/1998 | Frei et al. | | |
| 5,821,140 A | 10/1998 | Jost et al. | | |
| 5,869,382 A | 2/1999 | Kubota | | |
| 5,900,660 A | 5/1999 | Jost et al. | | |
| 5,955,758 A | 9/1999 | Sandhu et al. | | |
| 5,956,594 A | 9/1999 | Yang et al. | | |
| 5,981,992 A | 11/1999 | Kenney | | |
| 5,989,953 A | 11/1999 | Liang et al. | | |
| 5,990,021 A | 11/1999 | Prall et al. | | |
| 6,037,212 A | 3/2000 | Chao | | |
| 6,037,218 A | 3/2000 | Dennison et al. | | |
| 6,059,553 A | 5/2000 | Jin et al. | | |
| 6,090,700 A | 7/2000 | Tseng | | |
| 6,108,191 A | 8/2000 | Bruchhaus et al. | | |
| 6,110,774 A | 8/2000 | Jost et al. | | |
| 6,117,790 A | 9/2000 | Schafer et al. | | |
| 6,121,084 A | 9/2000 | Coursey | | |
| 6,133,620 A | 10/2000 | Uochi | | |
| 6,159,818 A | 12/2000 | Durcan et al. | | |
| 6,159,820 A | 12/2000 | Park | | |
| 6,180,450 B1 | 1/2001 | Dennison | | |
| 6,204,143 B1 | 3/2001 | Roberts et al. | | |
| 6,204,178 B1 | 3/2001 | Marsh | | |
| 6,225,184 B1 * | 5/2001 | Hayashi et al. | | 438/396 |
| 6,232,168 B1 | 5/2001 | Coursey | | |
| 6,245,684 B1 | 6/2001 | Zhao et al. | | |
| 6,249,019 B1 | 6/2001 | Sandhu et al. | | |
| 6,258,650 B1 | 7/2001 | Sunouchi | | |
| 6,274,497 B1 | 8/2001 | Lou | | |
| 6,303,518 B1 | 10/2001 | Tian et al. | | |
| 6,303,956 B1 | 10/2001 | Sandhu et al. | | |
| 6,323,528 B1 | 11/2001 | Yamazaki et al. | | |
| 6,329,683 B2 | 12/2001 | Kohyama | | |
| 6,331,461 B1 | 12/2001 | Juengling | | |
| 6,372,554 B1 | 4/2002 | Kawakita et al. | | |
| 6,372,574 B1 | 4/2002 | Lane et al. | | |
| 6,383,861 B1 | 5/2002 | Gonzalez et al. | | |
| 6,399,490 B1 | 6/2002 | Jammy et al. | | |
| 6,403,442 B1 | 6/2002 | Reinberg | | |
| 6,432,472 B1 | 8/2002 | Farrell et al. | | |
| 6,458,653 B1 | 10/2002 | Jang | | |
| 6,458,925 B1 | 10/2002 | Fasano | | |
| 6,459,138 B2 | 10/2002 | Reinberg | | |
| 6,475,855 B1 | 11/2002 | Fishburn | | |
| 6,476,432 B1 | 11/2002 | Basceri et al. | | |
| 6,476,437 B2 * | 11/2002 | Liaw | | 257/308 |
| 6,482,749 B1 | 11/2002 | Billington et al. | | |
| 6,583,063 B1 | 6/2003 | Khan et al. | | |
| 6,617,222 B1 | 9/2003 | Coursey | | |
| 6,620,680 B2 | 9/2003 | Durcan et al. | | |
| 6,620,724 B1 | 9/2003 | Schroeder et al. | | |
| 6,645,869 B1 | 11/2003 | Chu et al. | | |
| 6,656,748 B2 | 12/2003 | Hall et al. | | |
| 6,667,502 B1 | 12/2003 | Agarwal et al. | | |
| 6,673,693 B2 | 1/2004 | Kirchhoff | | |
| 6,696,745 B2 | 2/2004 | Sandhu et al. | | |
| 6,703,273 B2 | 3/2004 | Wang et al. | | |
| 6,707,088 B2 | 3/2004 | Fishburn | | |
| 6,709,978 B2 | 3/2004 | Geusic et al. | | |
| 6,720,232 B1 | 4/2004 | Tu et al. | | |
| 6,767,789 B1 | 7/2004 | Bronner et al. | | |
| 6,784,112 B2 | 8/2004 | Arita et al. | | |
| 6,784,479 B2 | 8/2004 | Park | | |
| 6,787,833 B1 | 9/2004 | Fishburn | | |
| 6,812,513 B2 | 11/2004 | Geusic et al. | | |
| 6,822,261 B2 | 11/2004 | Mase et al. | | |
| 6,822,280 B2 | 11/2004 | Ito et al. | | |
| 6,844,230 B2 | 1/2005 | Reinberg | | |
| 6,849,496 B2 | 2/2005 | Jaiprakash et al. | | |
| 6,853,023 B2 | 2/2005 | Goebel | | |
| 6,861,330 B2 | 3/2005 | Basceri et al. | | |
| 6,890,814 B2 | 5/2005 | Sandhu et al. | | |
| 6,893,914 B2 | 5/2005 | Kim et al. | | |
| 6,897,109 B2 | 5/2005 | Jin et al. | | |
| 6,927,122 B2 | 8/2005 | Geusic et al. | | |
| 6,927,170 B2 | 8/2005 | Zheng | | |
| 6,930,640 B2 | 8/2005 | Chung et al. | | |
| 6,936,880 B2 | 8/2005 | Park | | |
| 6,939,794 B2 | 9/2005 | Yin et al. | | |
| 6,961,350 B1 | 11/2005 | Bendak et al. | | |
| 6,962,846 B2 | 11/2005 | Fishburn et al. | | |
| 6,991,980 B2 | 1/2006 | Park | | |
| 7,005,379 B2 | 2/2006 | Sinha et al. | | |
| 7,042,040 B2 | 5/2006 | Horiguchi | | |
| 7,053,435 B2 | 5/2006 | Yeo et al. | | |
| 7,053,453 B2 | 5/2006 | Tsao et al. | | |
| 7,064,028 B2 | 6/2006 | Ito et al. | | |
| 7,064,365 B2 | 6/2006 | An et al. | | |
| 7,067,385 B2 | 6/2006 | Manning | | |
| 7,071,055 B2 | 7/2006 | Fishburn | | |
| 7,073,969 B2 | 7/2006 | Kamm | | |
| 7,074,669 B2 | 7/2006 | Iijima et al. | | |
| 7,081,384 B2 | 7/2006 | Birner et al. | | |
| 7,084,451 B2 | 8/2006 | Forbes et al. | | |
| 7,087,484 B2 | 8/2006 | Goldbach et al. | | |
| 7,094,701 B2 | 8/2006 | Umemoto et al. | | |
| 7,115,500 B1 | 10/2006 | Torres | | |
| 7,115,531 B2 | 10/2006 | Shaffer et al. | | |
| 7,122,424 B2 | 10/2006 | Tu et al. | | |
| 7,125,781 B2 | 10/2006 | Manning et al. | | |
| 7,153,778 B2 | 12/2006 | Busch et al. | | |
| 7,160,788 B2 | 1/2007 | Sandhu et al. | | |
| 7,179,706 B2 | 2/2007 | Patraw et al. | | |
| 7,199,005 B2 | 4/2007 | Sandhu et al. | | |
| 7,202,127 B2 | 4/2007 | Busch et al. | | |
| 7,223,690 B2 | 5/2007 | Kondo et al. | | |
| 7,226,845 B2 | 6/2007 | Manning et al. | | |
| 7,235,441 B2 | 6/2007 | Yasui et al. | | |
| 7,235,479 B2 | 6/2007 | Verhaverbeke | | |
| 7,235,485 B2 | 6/2007 | Kwak et al. | | |
| 7,268,034 B2 | 9/2007 | Basceri et al. | | |
| 7,268,039 B2 | 9/2007 | Fishburn et al. | | |
| 7,271,051 B2 | 9/2007 | Manning et al. | | |
| 7,273,779 B2 | 9/2007 | Fishburn et al. | | |
| 7,279,379 B2 | 10/2007 | Tran et al. | | |
| 7,282,756 B2 | 10/2007 | Agarwal et al. | | |
| 7,288,806 B2 | 10/2007 | Tran et al. | | |
| 7,320,911 B2 | 1/2008 | Basceri et al. | | |
| 7,321,149 B2 | 1/2008 | Busch et al. | | |
| 7,321,150 B2 | 1/2008 | Fishburn et al. | | |
| 7,335,935 B2 | 2/2008 | Sinha et al. | | |
| 7,341,909 B2 | 3/2008 | McDaniel et al. | | |
| 7,384,847 B2 | 6/2008 | Tran et al. | | |
| 7,387,939 B2 | 6/2008 | Manning | | |
| 7,393,741 B2 | 7/2008 | Sandhu et al. | | |
| 7,393,743 B2 | 7/2008 | Manning | | |
| 7,413,952 B2 | 8/2008 | Busch et al. | | |
| 7,420,238 B2 | 9/2008 | Manning et al. | | |
| 7,439,152 B2 | 10/2008 | Manning | | |

(56) References Cited

U.S. PATENT DOCUMENTS

| | | | |
|---|---|---|---|
| 7,440,255 B2 | 10/2008 | McClure et al. |
| 7,442,600 B2 | 10/2008 | Wang et al. |
| 7,445,990 B2 | 11/2008 | Busch et al. |
| 7,445,991 B2 | 11/2008 | Manning |
| 7,449,391 B2 | 11/2008 | Manning et al. |
| 7,459,362 B2 | 12/2008 | Juengling |
| 7,474,215 B2 | 1/2009 | Scott et al. |
| 7,517,754 B2 | 4/2009 | McDaniel et al. |
| 7,534,694 B2 | 5/2009 | Manning |
| 7,538,036 B2 | 5/2009 | Busch et al. |
| 7,544,563 B2 | 6/2009 | Manning |
| 7,557,013 B2 | 7/2009 | Bhat et al. |
| 7,557,015 B2 | 7/2009 | Sandhu et al. |
| 7,573,088 B2 | 8/2009 | Juengling |
| 7,576,441 B2 | 8/2009 | Yin et al. |
| 7,629,262 B2 | 12/2009 | Kim et al. |
| 7,638,392 B2 | 12/2009 | Wang et al. |
| 7,655,968 B2 | 2/2010 | Manning |
| 7,682,924 B2 | 3/2010 | Bhat et al. |
| 7,683,413 B2 | 3/2010 | Graettinger et al. |
| 7,700,469 B2 | 4/2010 | Benson |
| 7,759,193 B2 | 7/2010 | Fishburn |
| 7,785,962 B2 | 8/2010 | Bhat et al. |
| 7,807,580 B2 | 10/2010 | Lee et al. |
| 7,902,081 B2 | 3/2011 | Raghu et al. |
| 8,105,904 B2 | 1/2012 | Oh et al. |
| 8,134,823 B2 | 3/2012 | Chen et al. |
| 8,268,695 B2 | 9/2012 | Kiehlbach et al. |
| 8,274,777 B2 | 9/2012 | Kiehlbach |
| 8,518,788 B2 | 8/2013 | Lee |
| 2001/0012223 A1 | 8/2001 | Kohyama |
| 2001/0026974 A1 | 10/2001 | Reinberg |
| 2001/0038111 A1 | 11/2001 | DeBoer et al. |
| 2001/0044181 A1 | 11/2001 | Nakamura |
| 2002/0003249 A1 | 1/2002 | Park |
| 2002/0022339 A1 | 2/2002 | Kirchhoff |
| 2002/0030221 A1 | 3/2002 | Sandhu et al. |
| 2002/0039826 A1 | 4/2002 | Reinberg |
| 2002/0086479 A1 | 7/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0085420 A1 | 5/2003 | Ito et al. |
| 2003/0087501 A1 | 5/2003 | Park |
| 2003/0134468 A1 | 7/2003 | Wang et al. |
| 2003/0153146 A1 | 8/2003 | Won et al. |
| 2003/0169629 A1 | 9/2003 | Goebel |
| 2003/0178684 A1 | 9/2003 | Nakamura |
| 2003/0190782 A1 | 10/2003 | Ko et al. |
| 2003/0227044 A1 | 12/2003 | Park |
| 2004/0018679 A1 | 1/2004 | Yu et al. |
| 2004/0056295 A1 | 3/2004 | Agarwal et al. |
| 2004/0110340 A1 | 6/2004 | Kim et al. |
| 2004/0150070 A1 | 8/2004 | Okada et al. |
| 2004/0175884 A1* | 9/2004 | Kang et al. ............... 438/397 |
| 2004/0188738 A1 | 9/2004 | Farnworth et al. |
| 2004/0232106 A1 | 11/2004 | Oka et al. |
| 2005/0023588 A1 | 2/2005 | Sandhu et al. |
| 2005/0051822 A1 | 3/2005 | Manning |
| 2005/0054159 A1 | 3/2005 | Manning et al. |
| 2005/0104110 A1 | 5/2005 | Yeo et al. |
| 2005/0158949 A1 | 7/2005 | Manning |
| 2005/0167724 A1 | 8/2005 | Choi et al. |
| 2005/0176210 A1 | 8/2005 | Kim et al. |
| 2005/0287738 A1 | 12/2005 | Cho et al. |
| 2005/0287780 A1 | 12/2005 | Manning et al. |
| 2005/0287795 A1 | 12/2005 | Torek et al. |
| 2006/0006502 A1 | 1/2006 | Yin et al. |
| 2006/0014344 A1 | 1/2006 | Manning |
| 2006/0024958 A1 | 2/2006 | Ali |
| 2006/0024966 A1 | 2/2006 | Umemoto et al. |
| 2006/0046420 A1 | 3/2006 | Manning |
| 2006/0051918 A1 | 3/2006 | Busch et al. |
| 2006/0063344 A1 | 3/2006 | Manning et al. |
| 2006/0063345 A1 | 3/2006 | Manning et al. |
| 2006/0115951 A1 | 6/2006 | Mosley |
| 2006/0115952 A1 | 6/2006 | Wu |
| 2006/0121672 A1 | 6/2006 | Basceri et al. |
| 2006/0148190 A1 | 7/2006 | Busch |
| 2006/0176210 A1 | 8/2006 | Nakamura et al. |
| 2006/0186451 A1 | 8/2006 | Dusberg et al. |
| 2006/0211196 A1 | 9/2006 | Tanaka et al. |
| 2006/0211211 A1 | 9/2006 | Sandhu et al. |
| 2006/0237762 A1 | 10/2006 | Park |
| 2006/0249798 A1 | 11/2006 | Manning |
| 2006/0261440 A1 | 11/2006 | Manning |
| 2006/0263968 A1 | 11/2006 | Manning |
| 2006/0286783 A1 | 12/2006 | Papanu et al. |
| 2006/0289914 A1 | 12/2006 | Juengling |
| 2007/0032014 A1 | 2/2007 | Sandhu et al. |
| 2007/0045699 A1 | 3/2007 | Liao et al. |
| 2007/0048976 A1 | 3/2007 | Raghu |
| 2007/0057304 A1 | 3/2007 | Boescke et al. |
| 2007/0066010 A1 | 3/2007 | Ando |
| 2007/0093022 A1 | 4/2007 | Basceri |
| 2007/0099328 A1 | 5/2007 | Chiang et al. |
| 2007/0099423 A1 | 5/2007 | Chen et al. |
| 2007/0145009 A1 | 6/2007 | Fucsko et al. |
| 2007/0181929 A1 | 8/2007 | Juengling |
| 2007/0196978 A1 | 8/2007 | Manning |
| 2007/0202686 A1 | 8/2007 | Dixit et al. |
| 2007/0207622 A1 | 9/2007 | Rana et al. |
| 2007/0238259 A1 | 10/2007 | Bhat |
| 2007/0257323 A1 | 11/2007 | Tsui et al. |
| 2008/0090416 A1 | 4/2008 | Raghu et al. |
| 2008/0171137 A1 | 7/2008 | Kim et al. |
| 2008/0174430 A1 | 7/2008 | Scott et al. |
| 2008/0206950 A1* | 8/2008 | Bhat et al. ............... 438/397 |
| 2009/0047769 A1 | 2/2009 | Bhat et al. |
| 2009/0176011 A1 | 7/2009 | Kiehbauch |
| 2009/0251845 A1 | 10/2009 | Kiehbauch |
| 2010/0009512 A1 | 1/2010 | Fishburn |
| 2010/0041204 A1 | 2/2010 | Kiehlbauch |
| 2010/0112798 A1 | 5/2010 | Lai et al. |
| 2011/0151655 A1 | 6/2011 | Chan et al. |
| 2011/0183522 A1 | 7/2011 | Mikhaylichenko et al. |
| 2011/0227167 A1 | 9/2011 | Chuang et al. |
| 2012/0012922 A1 | 1/2012 | Jang |
| 2012/0040507 A1 | 2/2012 | Lee |
| 2013/0008000 A1 | 1/2013 | Kiehlbauch |
| 2013/0164902 A1 | 6/2013 | Greeley et al. |

FOREIGN PATENT DOCUMENTS

| | | |
|---|---|---|
| CN | 101208775 | 6/2008 |
| CN | 200980126565.1 | 12/2013 |
| DE | 4447804 | 1/2011 |
| JP | 1996-27428 | 10/1996 |
| JP | 1998-189912 | 7/1998 |
| JP | 11-026719 | 1/1999 |
| JP | 1999-191615 | 7/1999 |
| JP | 2000-196038 | 7/2000 |
| JP | 2001-189438 | 7/2001 |
| JP | 2003-142605 | 5/2003 |
| JP | 2003-264246 | 9/2003 |
| JP | 2003-273247 | 9/2003 |
| JP | 2003-297952 | 10/2003 |
| JP | 2004-072078 | 3/2004 |
| JP | 2004-111626 | 4/2004 |
| JP | 2004-128463 | 4/2004 |
| JP | 2004-155810 | 6/2004 |
| JP | 2004-032982 | 2/2005 |
| JP | 2006-032695 | 2/2006 |
| JP | 2006-135364 | 5/2006 |
| KR | 20010061020 | 7/2001 |
| KR | 20010114003 | 12/2001 |
| KR | 102001108963 | 12/2001 |
| KR | 1020030058018 | 7/2003 |
| KR | 1020050000896 | 1/2005 |
| KR | 10-520223 | 10/2005 |
| TW | 513801 | 12/2002 |
| TW | I252511 | 4/2006 |

(56) References Cited

FOREIGN PATENT DOCUMENTS

| TW | I307160 | 3/2009 |
|---|---|---|
| TW | 096121062 | 8/2012 |
| WO | WO 2005/024936 | 3/2005 |
| WO | WO 2005/062349 | 7/2005 |
| WO | WO PCT/US2004/027898 | 2/2006 |
| WO | WO PCT/US2004/040252 | 5/2006 |
| WO | WO PCT/US2006/006806 | 7/2006 |
| WO | WO PCT/US2006/006806 | 1/2007 |
| WO | WO PCT/US2006/006806 | 3/2007 |
| WO | WO PCT/US2008/070071 | 7/2008 |
| WO | WO PCT/US2008/070071 | 7/2009 |
| WO | WO PCT/US2009/046946 | 1/2010 |
| WO | WO PCT/US2009/046946 | 1/2011 |

OTHER PUBLICATIONS

Banhart., "Aluminum Foams: on the road to real applications", MRS Bulletin, Apr. 2003, pp. 290-295.
Crouse et al., "Self-Assembled Nanostructures Using Anodized Alunmina Thin Films for Optoelectronic applications", IEEE, pp. 234-235, 1999.
Gibson et al., "Cellular Solids", MRS Bulletin, Apr. 2003, pp. 270-274.
Green et al., "Cellular Ceramics: Intriguing Structures, Novel Properties, and innovative Applications", MRS Bulletin, Apr. 2003, pp. 296-300.
Green et al., "The Structure and Applications of Cellular Ceramics", MRS Bulletin, Apr. 2003, 10 pages.
J Robertson, Diamond-like amorphous carbon, Material Science and Engineering R 37 (2002) 129-281.
John Robertson, Hard Amorphous (Diamond-Like) Carbons, Prog Solid St Chem. vol. 21, pp. 199-333, (1991).
Karp et al., "Scaffolds for Tissue Engineering", MRS Bulletin, Apr. 2003, pp. 301-302.
Kim et al., "A mechanically enhanced storage node for virtually unlimited height (MESH) capacitor aiming at sub 70nm DRAMs", IEEE, Jan. 2004, pp. 69-72.
Konovalov et al., "Chemistry of Materials", Chem. Mater., vol. 11, No. 8, pp. 1949-1951 (Aug. 1999).
Kraynik, "Foam Structure: From Soap Froth to Solid Foams", MRS Bulletin, Apr. 2003, pp. 275-278.
Li., "Metal-assisted chemical etching in $HF/H_2O_2$ produces porous silicon", Applied Physics Letters, vol. 77, No. 16, Oct. 16, 2000; pp. 2572-2574.
Liang et al., "Nonlithographic Fabrication of Lateral Superlattices for Nanometric Electromagnetic-Optic . . . ", IEEE J. Selected Topics in Quantum Electr., vol. 8, No. 5, pp. 998-1008 (Sep./Oct. 2002).
Liu et al,, "Ordered anodic alumina nanochannels on focused-ion-beam-prepatterned aluminum surfaces", appl. Phys. Lett. vol. 78, No. 1, pp. 120-122 (Jan. 2001).
Maire et al., "In Situ X-Ray tomography Measurements of Deformation in Sellular Solids", MRS Bulletin Apr. 2003, pp. 284-289.
Masuda at al., "Highly ordered nanochannel-array architecture in anodic alumina", App. Phys. Lett, vol. 71, No. 19, Nov. 1997, pp. 2770-2772.
Nadeem et al., "Fabrication of Microstructures Using Aluminum Anodization Techniques", pre-2004, pp. 274-277.
Oh et al., "Preparation and Pore-Characteristics Control of Nano-Porous Materials Using Organometallic Building Blocks", Carbon Science, vol. 4, No. Mar. 2003, pp. 1-9.
Onck, "Scale Effects in Cellular Metals", MRS Bulletin, Apr. 2003, pp. 279-283.
O'Sullivan et al., "The Morphology and Mechanism of Formation of Porous Anodic Films on Aluminum", Proc. Roy. Soc. Lond. A, vol. 317, 1970, pp. 511-543.
Park et al., "Block Copolymer Lithography: Periodic Arrays of ~1011 Holes in 1 Square Centimeter", Science, vol. 276, May 1997, pp. 1401-1404.
Park et al., "Novel Robust Cell Capacitor (Leaning Exterminated Ring Type Insulator) and New Storage Node Contact", IEEE, 2004 Symposium on VLSI Technology Digest of Technical Papers, pp. 34-35.
Shingubara, "Fabrication of nanomaterials using porous aluina templates", J. Nanoparticle Res., vol. 5, 2003, pp. 17-30.
Tan et al., "High Aspect Ratio Microstructures on Porous Anodic Aluminum Oxide", IEEE, 1995, pp. 267-272.
Terai et al. "Newly developed RELACS process and materials for 65nm node device and beyond", Feb. 21, 2006; pp. 20-21; website: ieeexplore.ieee.org/iel5/10631/33565/01595193.pdf.
Tsukada et al., "Preparation and Application of Porous Silk Fibroin Materials", J. Appl. Polymer Sci., vol. 54, 1994, pp. 507-514.
Yasaitis et al., "A modular process for intergrating thick polysilicon MEMS devices with submicron CMOS", Analog Devices, Pre-2004.

* cited by examiner

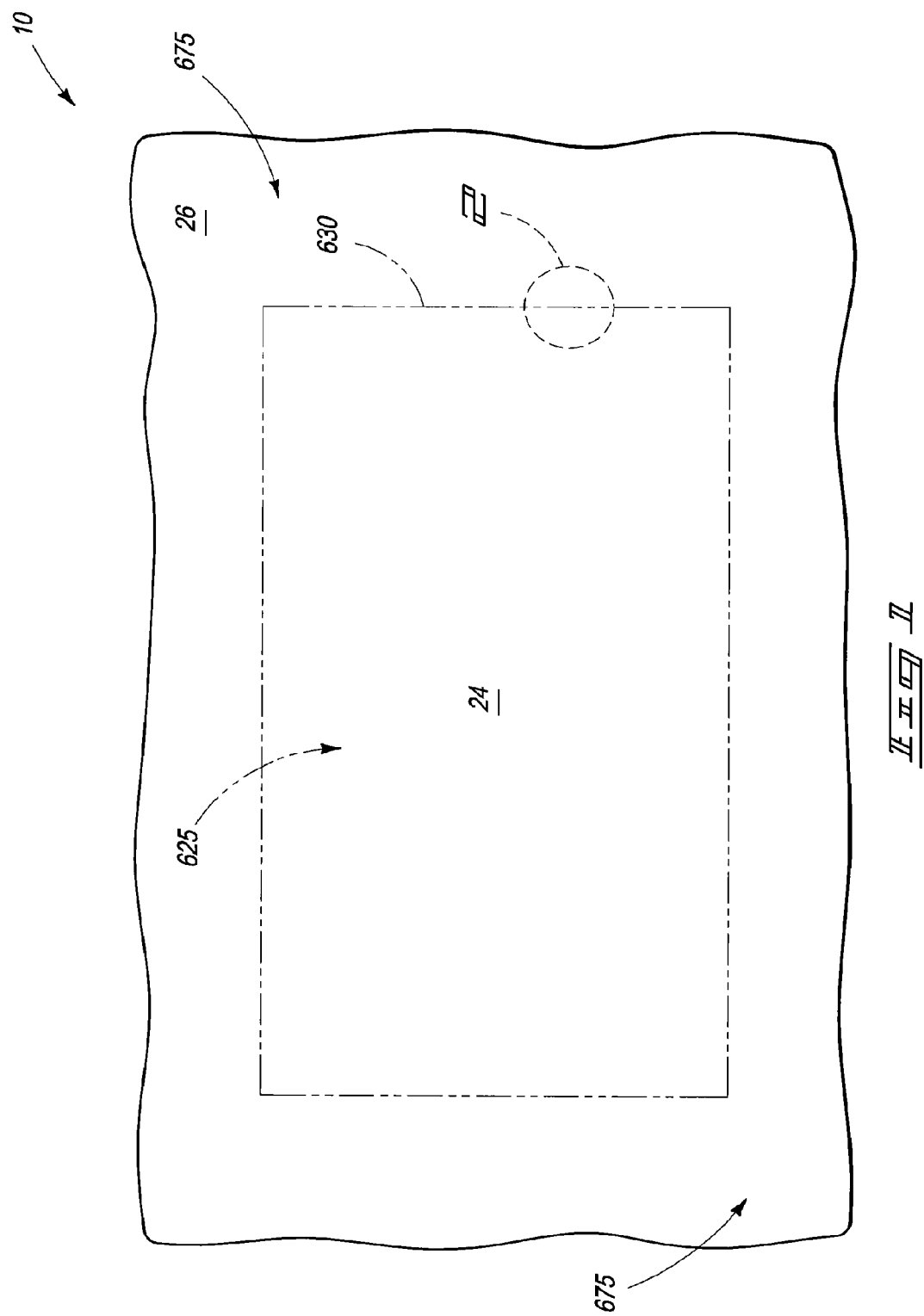

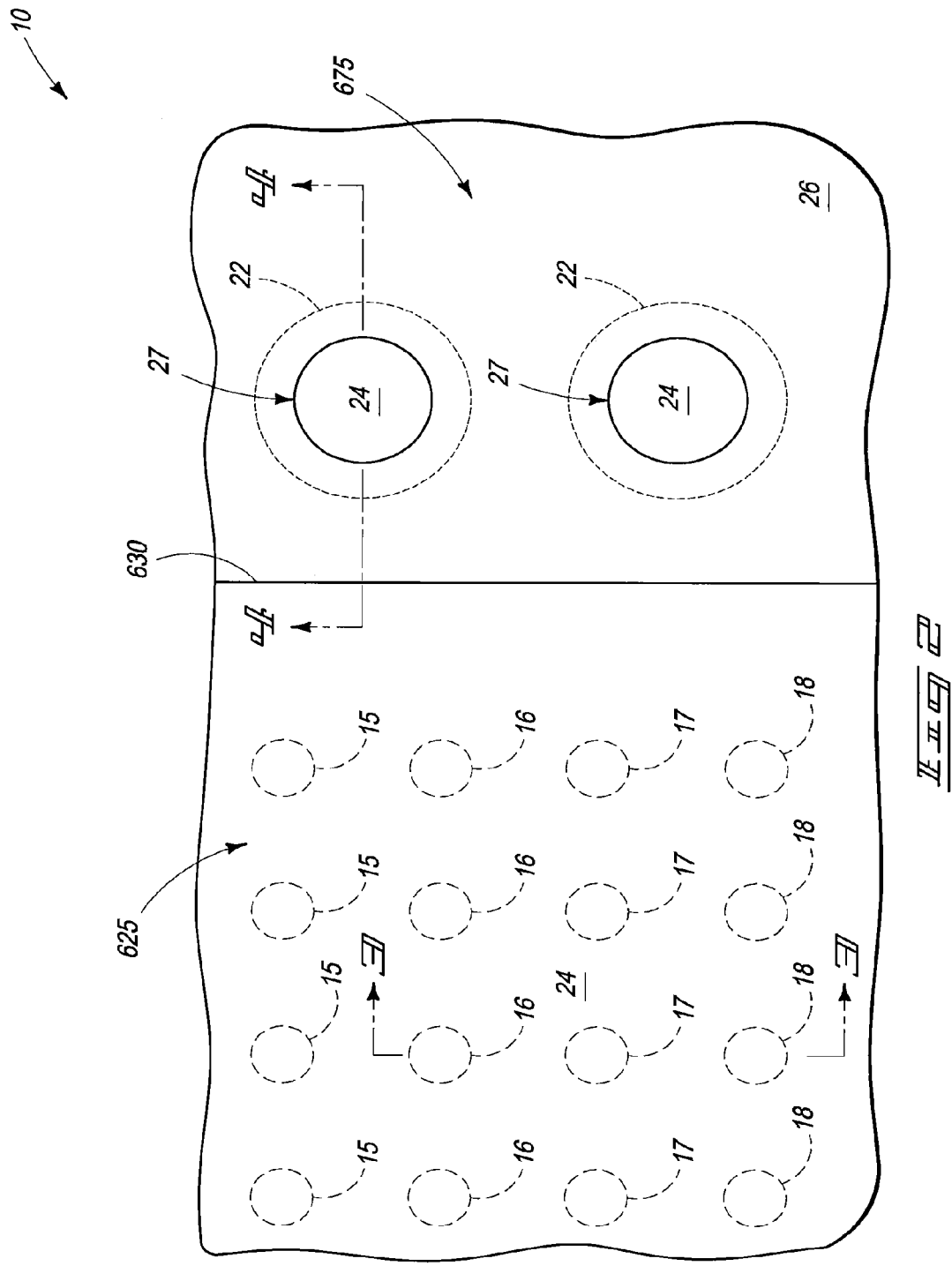

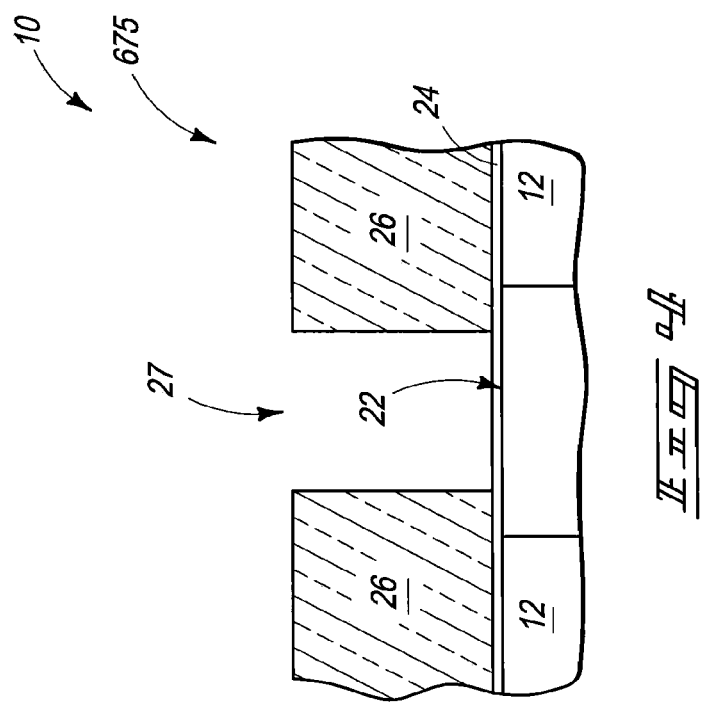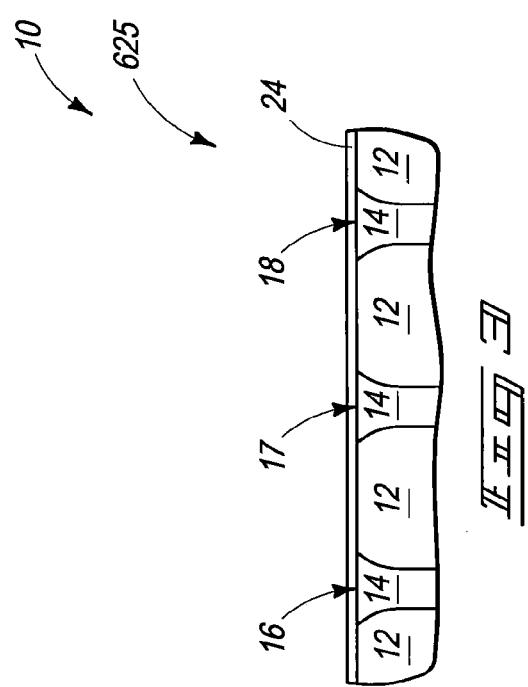

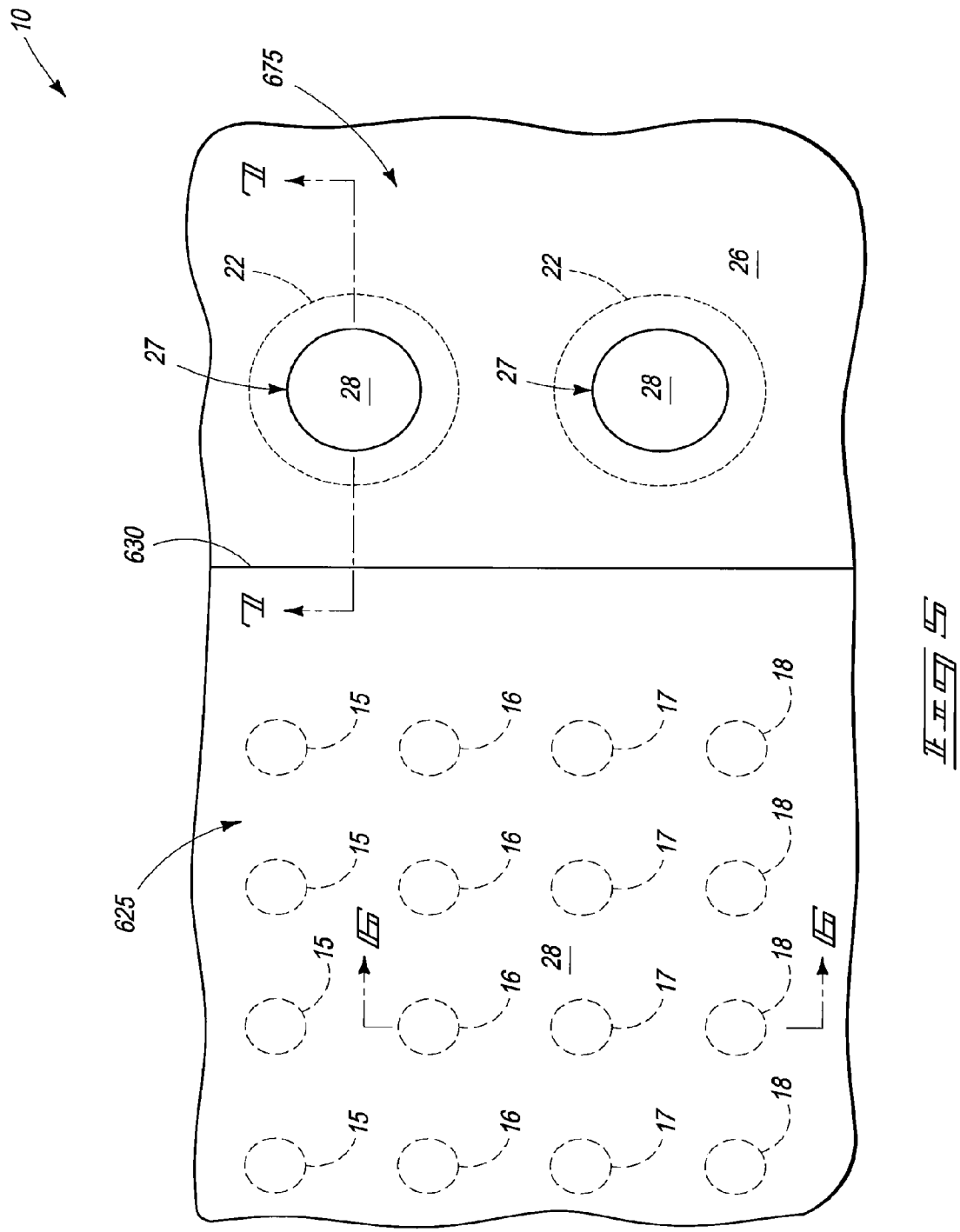

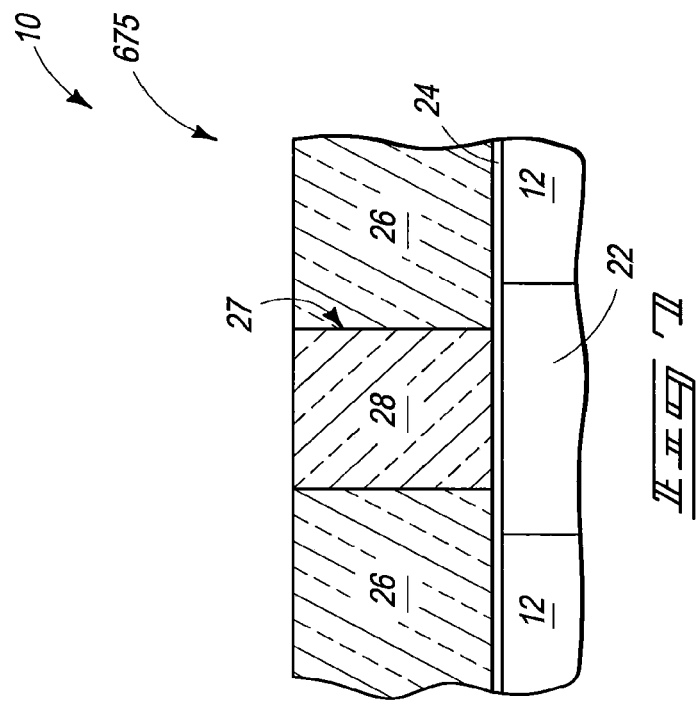
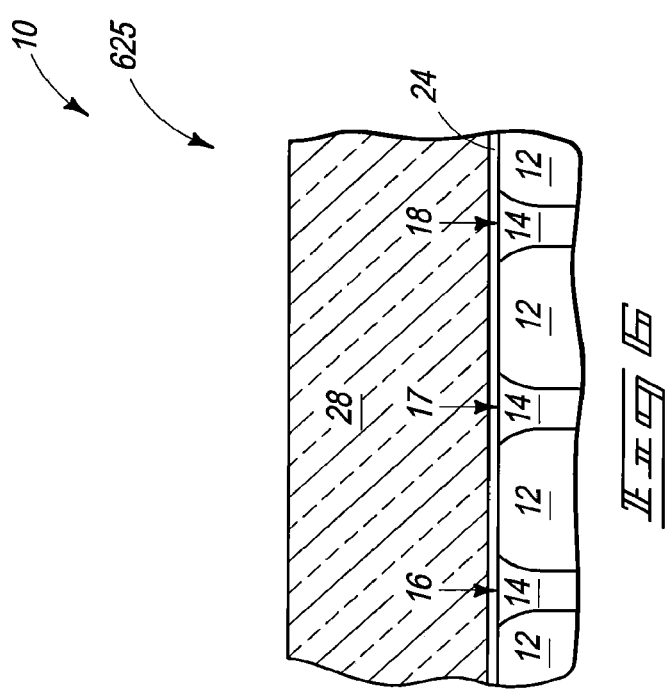

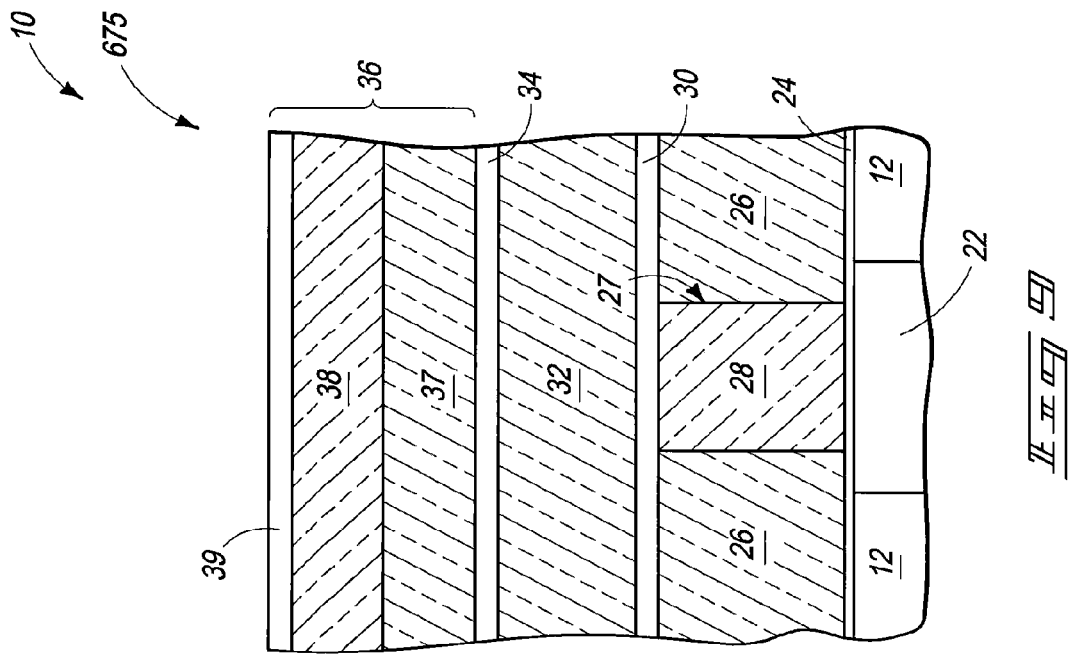
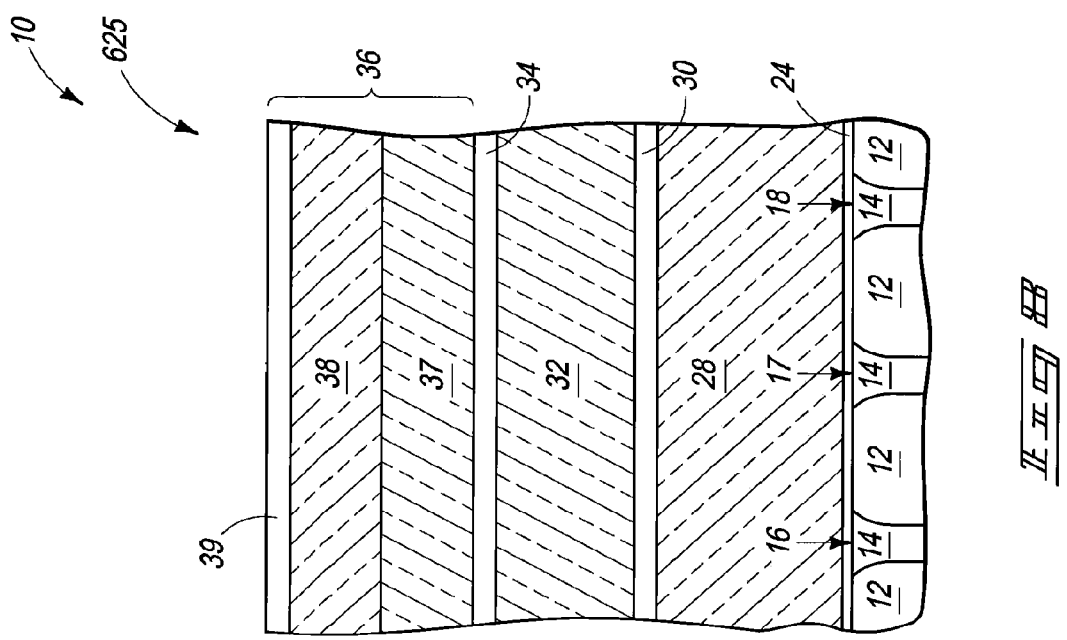

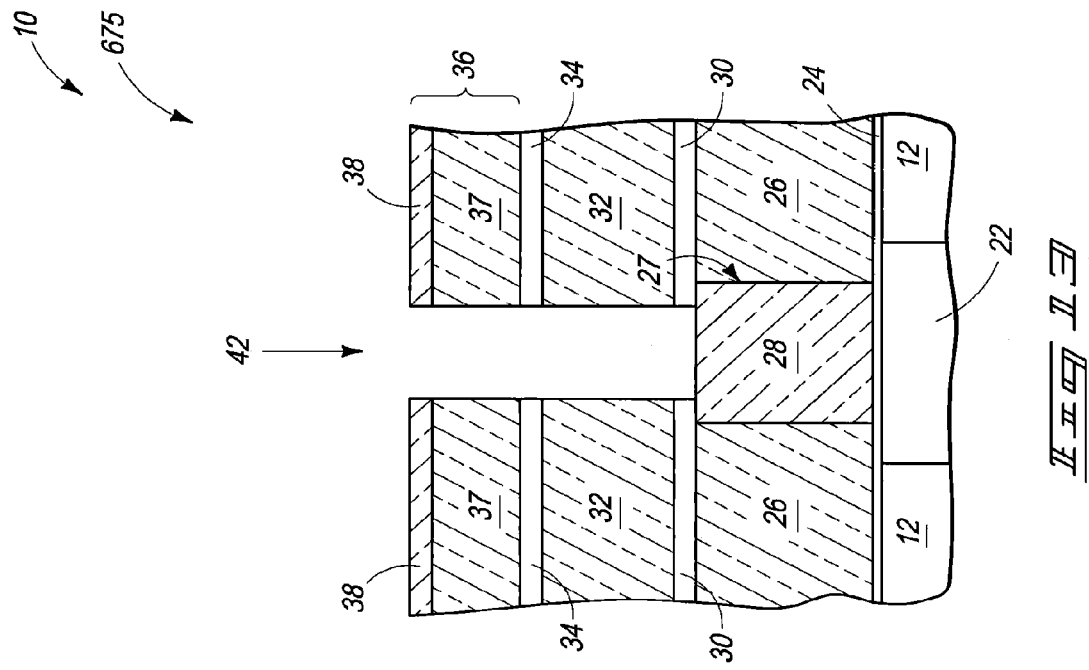
_FIG. 13_
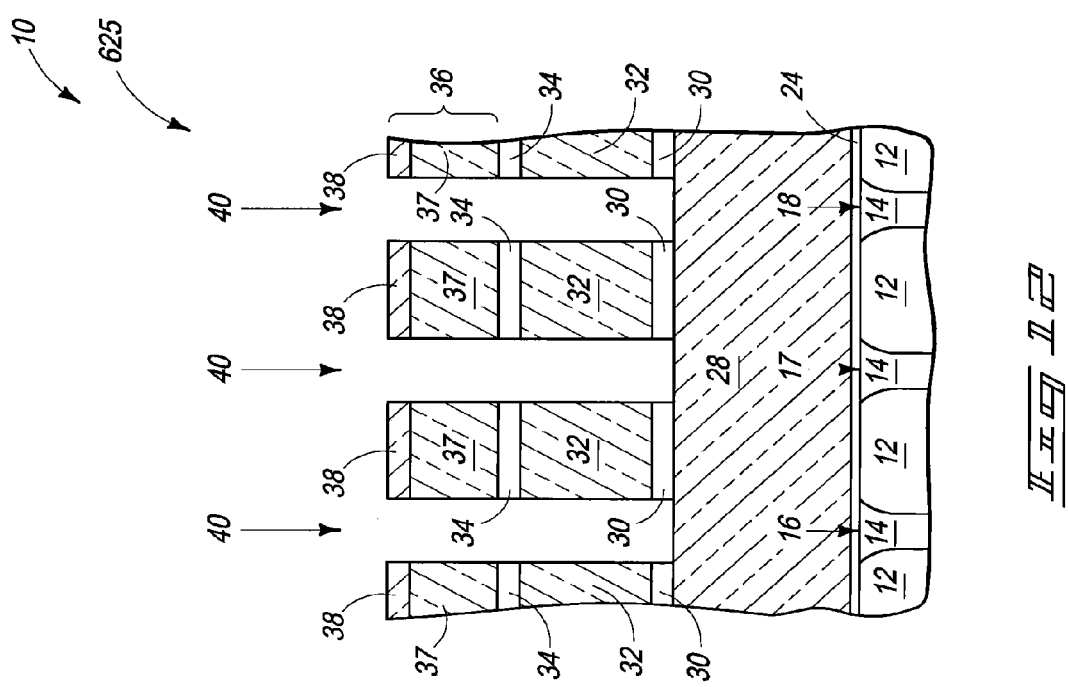
_FIG. 12_

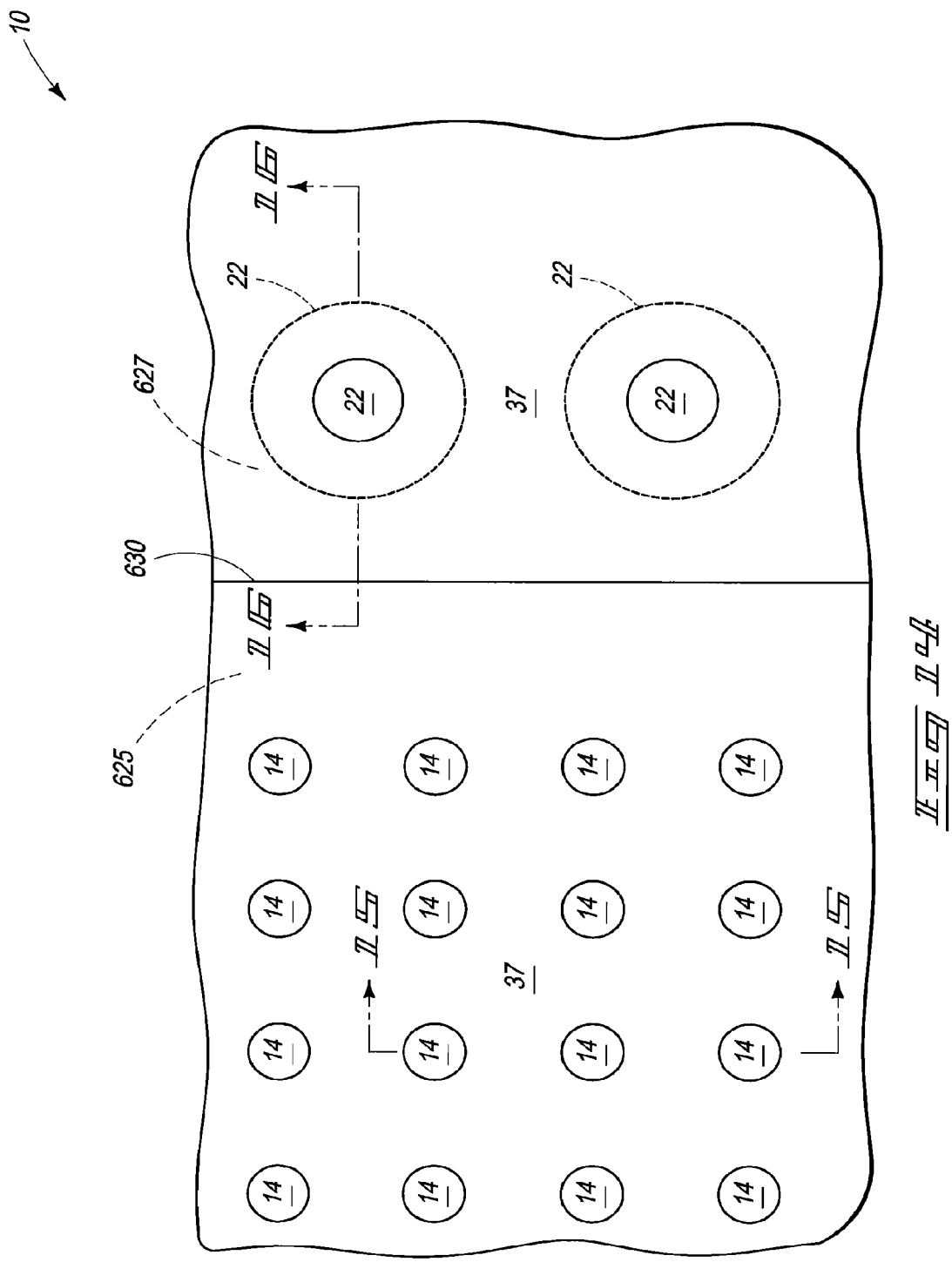

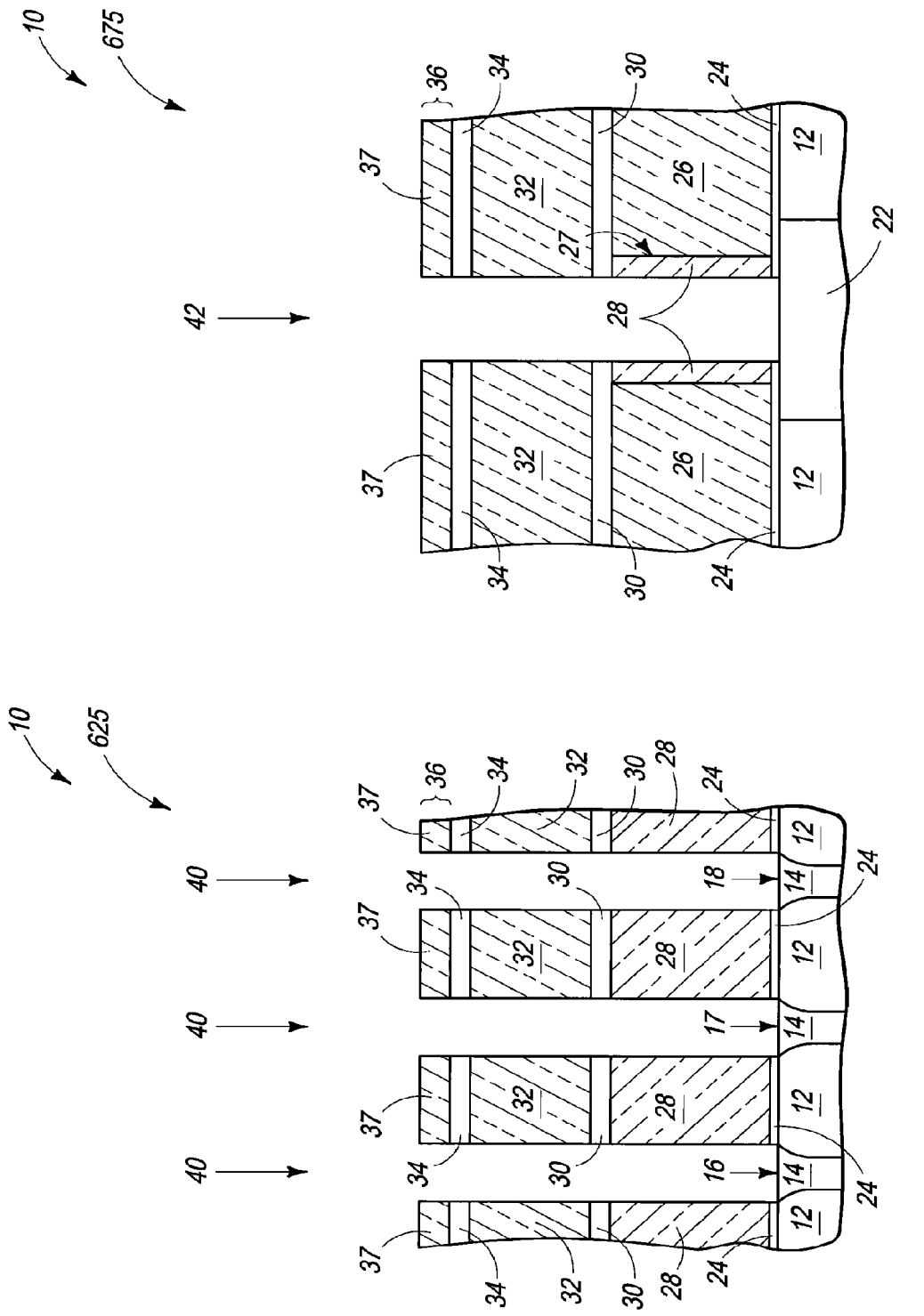

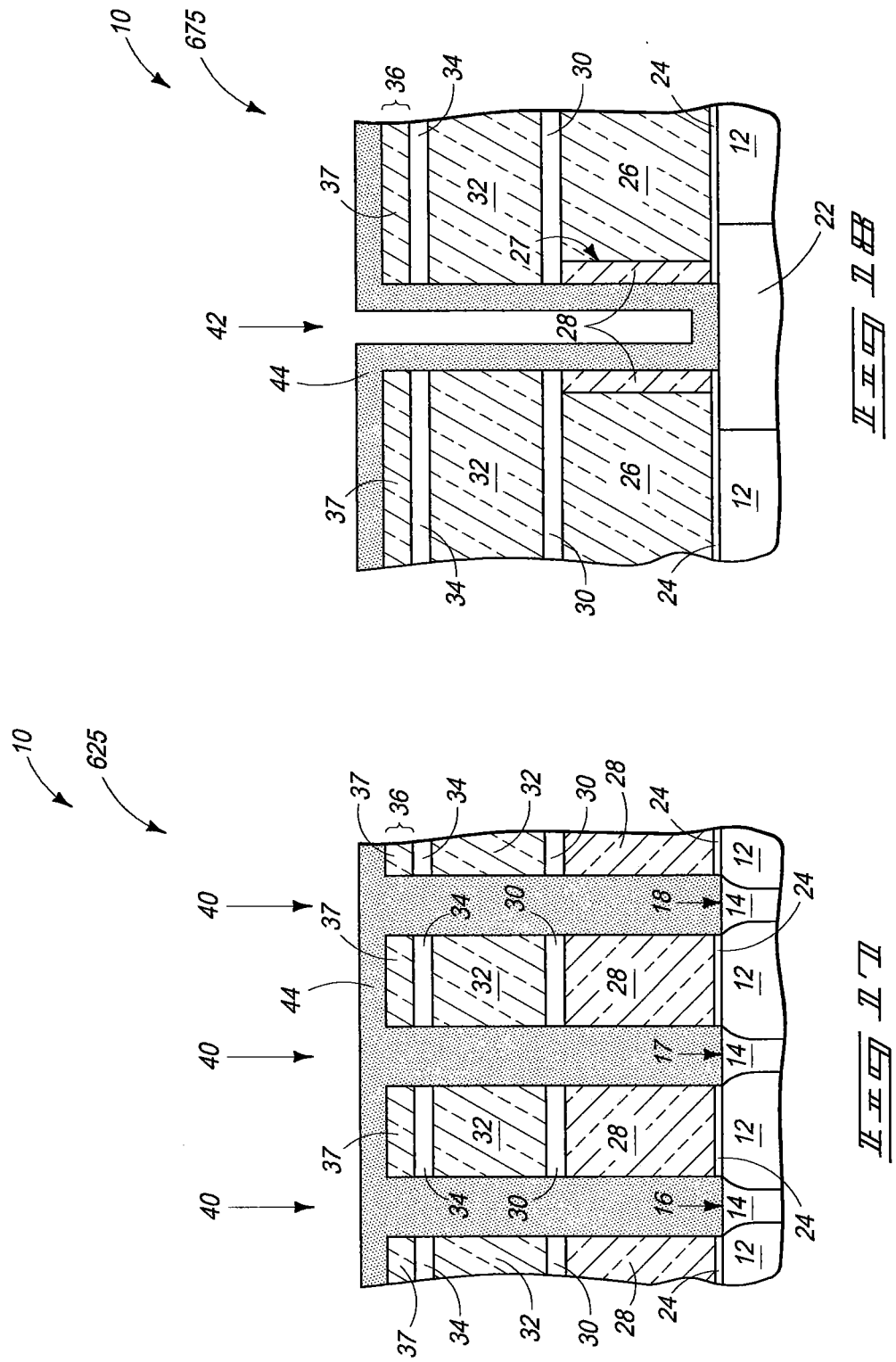

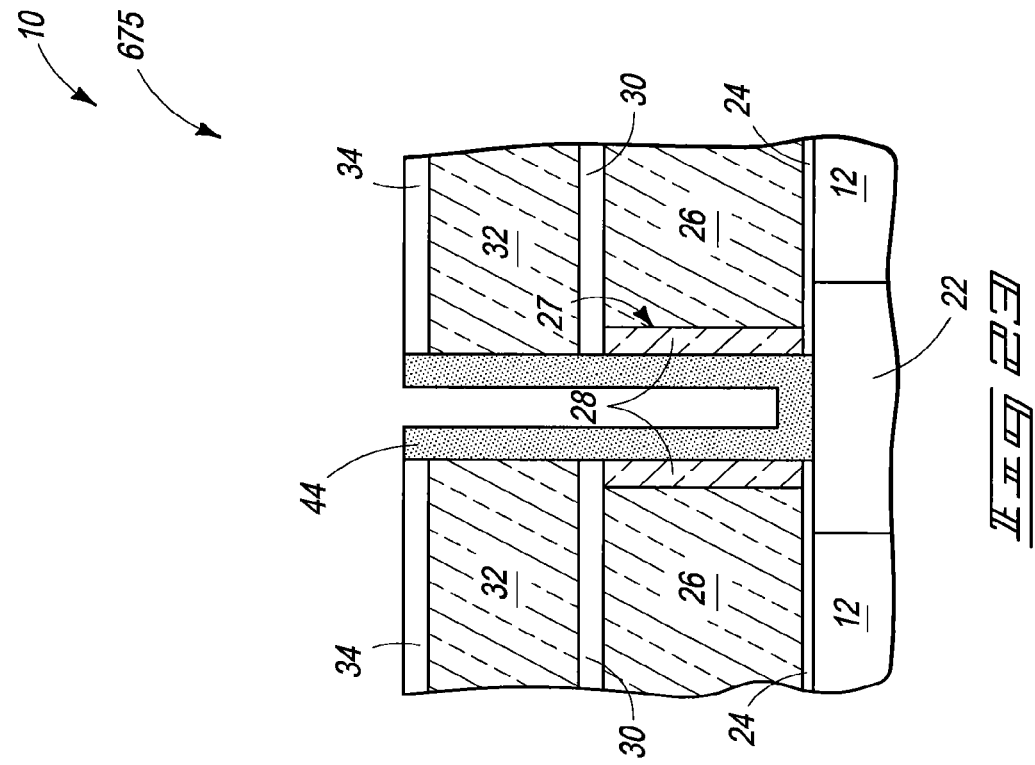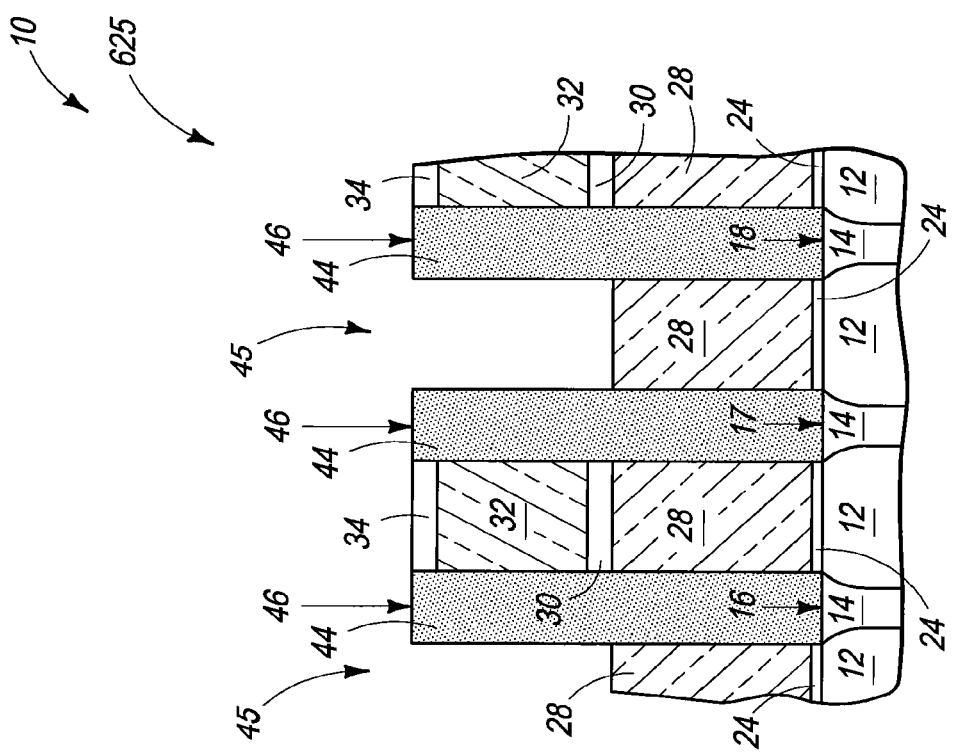

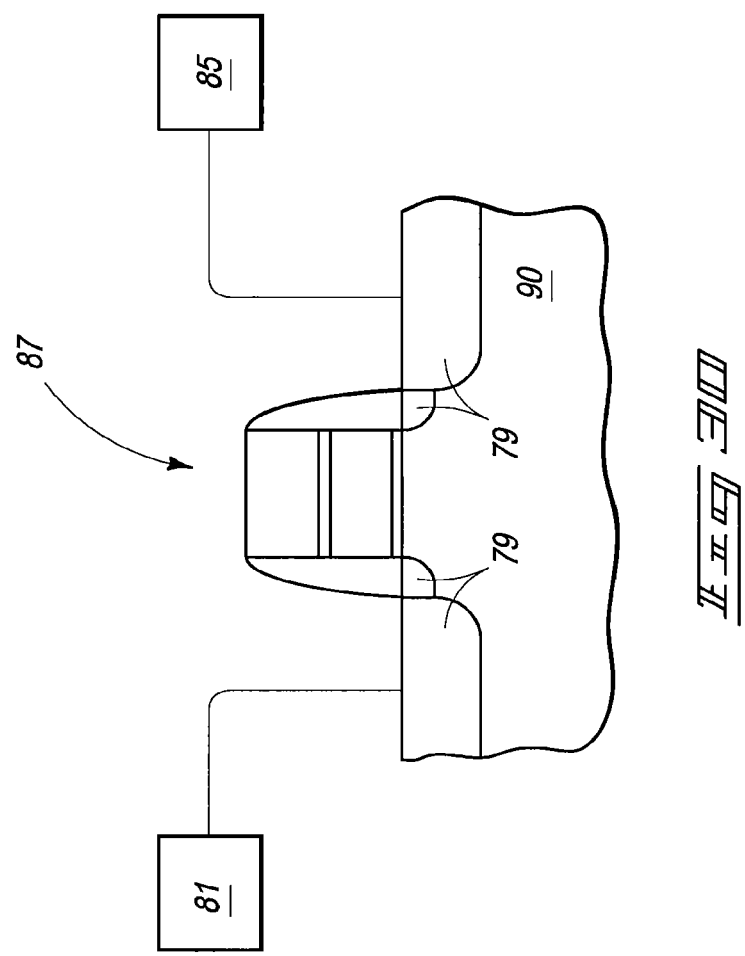

METHODS OF FORMING A PLURALITY OF CAPACITORS

RELATED PATENT DATA

This patent resulted from a continuation application of U.S. patent application Ser. No. 12/854,446, filed Aug. 11, 2010, entitled "Methods Of Forming A Plurality Of Capacitors", naming Che-Chi Lee as inventor, the disclosure of which is incorporated by reference.

TECHNICAL FIELD

Embodiments disclosed herein pertain to methods of forming a plurality of capacitors

BACKGROUND

Capacitors are one type of component commonly used in the fabrication of integrated circuits, for example in DRAM and other memory circuitry. A capacitor is comprised of two conductive electrodes separated by a non-conducting dielectric region. As integrated circuitry density has increased, there is a continuing challenge to maintain sufficiently high storage capacitance despite decreasing capacitor area. The increase in density has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage node electrode is formed. For example, an array of capacitor electrode openings for individual capacitors may be fabricated in such insulative capacitor electrode-forming material, with an example material being silicon dioxide doped with one or both of phosphorus and boron. The capacitor electrode openings may be formed by etching. It can be difficult to etch such openings within the insulative material, particularly where the openings are deep.

Further and regardless, it is often desirable to etch away most if not all of the capacitor electrode-forming material after individual capacitor electrodes have been formed within the openings. Such enables outer sidewall surfaces of the electrodes to provide increased area and thereby increased capacitance for the capacitors being formed. However, capacitor electrodes formed in deep openings are often correspondingly much taller than they are wide. This can lead to toppling of the capacitor electrodes, either during etching to expose the outer sidewalls surfaces, during transport of the substrate, and during deposition of the capacitor dielectric layer and/or outer capacitor electrode layer. U.S. Pat. No. 6,667,502 teaches the provision of a brace or retaining structure intended to alleviate such toppling. Other aspects associated in the formation of a plurality of capacitors, some of which include bracing structures, are also disclosed and are:

U.S. Pat. No. 7,067,385;
U.S. Pat. No. 7,125,781;
U.S. Pat. No. 7,199,005;
U.S. Pat. No. 7,202,127;
U.S. Pat. No. 7,387,939;
U.S. Pat. No. 7,439,152;
U.S. Pat. No. 7,517,753;
U.S. Pat. No. 7,544,563;
U.S. Pat. No. 7,557,013;
U.S. Pat. No. 7,557,015;
U.S. Patent Application No. 2008/0090416;
U.S. Patent Application No. 2008/0206950;
U.S. Pat. No. 7,320,911;
U.S. Pat. No. 7,682,924;
U.S. Patent Application No. 2010/0009512;

Fabrication of capacitors in memory circuitry may include forming an array of capacitors within a capacitor array area. Control or other circuitry area is often displaced from the capacitor array area, and the substrate may include an intervening area between the capacitor array area and the control or other circuitry area. In some instances, a trench is formed in the intervening area between the capacitor array area and the other circuitry area. Such trench may be formed commensurate with the fabrication of the openings within the capacitor array area within which the isolated capacitor electrodes will be received.

BRIEF DESCRIPTION OF THE DRAWINGS

FIG. 1 is a diagrammatic top plan view of a substrate fragment in process in accordance with an embodiment of the invention.

FIG. 2 is a diagrammatic enlargement of a portion of FIG. 1.

FIG. 3 is a section view through line 3-3 in FIG. 2.

FIG. 4 is a section view through line 4-4 in FIG. 2.

FIG. 5 is a view of the FIG. 2 substrate at a processing step subsequent to that shown by FIG. 2.

FIG. 6 is a section view through line 6-6 in FIG. 5.

FIG. 7 is a section view through line 7-7 in FIG. 5.

FIG. 8 is a view of the FIG. 6 substrate at a processing step subsequent to that shown by FIG. 6.

FIG. 9 is a view of the FIG. 7 substrate at a processing step subsequent to that shown by FIG. 7 and at the same processing sequence of FIG. 8.

FIG. 12 is a view of the FIG. 10 substrate at a processing step subsequent to that shown by FIG. 10.

FIG. 13 is a view of the FIG. 11 substrate at a processing step subsequent to that shown by FIG. 11 and at the same processing sequence of FIG. 12.

FIG. 14 is a diagrammatic top plan view of the substrate at a processing step subsequent to that shown by FIGS. 12 and 13.

FIG. 15 is a section view through line 15-15 in FIG. 14.

FIG. 16 is a section view through line 16-16 in FIG. 14.

FIG. 17 is a view of the FIG. 15 substrate at a processing step subsequent to that shown by FIG. 15.

FIG. 18 is a view of the FIG. 16 substrate at a processing step subsequent to that shown by FIG. 16 and at the same processing sequence of FIG. 17.

FIG. 22 is a section view through line 22-22 in FIG. 21.

FIG. 23 is a section view through line 23-23 in FIG. 21.

FIG. 30 is a diagrammatic and partial schematic of a substrate fragment.

DETAILED DESCRIPTION OF EXAMPLE EMBODIMENTS

Figure 11:
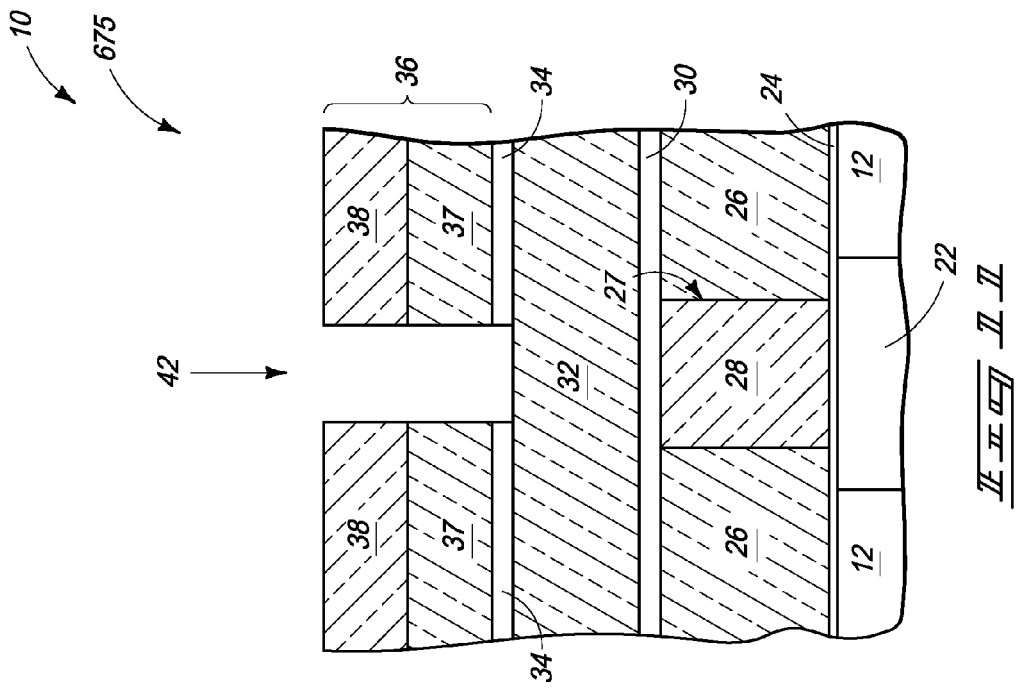
FIG. 11 is a view of the FIG. 9 substrate at a processing step subsequent to that shown by FIG. 9 and at the same processing sequence of FIG. 10.

Example methods of forming a plurality of capacitors are described with reference to FIGS. 1-29. Referring initially to FIGS. 1-4, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, and by way of example only, substrate 10 might comprise a bulk semiconductor material (not shown), for example bulk monocrystalline, and/or comprise semiconductor-on-insulator layers.

Substrate 10 may comprise a capacitor array area 625 and a circuitry area 675 other than capacitor array area 625 that is immediately adjacent capacitor array area 625. An example interface line 630 is used in the drawings to define capacitor array area 625 and immediately adjacent circuitry area 675. In the depicted example, immediately adjacent circuitry area 675 completely surrounds and encircles capacitor array area 625 (FIG. 1), and circuitry area 675 comprises a peripheral circuitry area to that of capacitor array area 625. Alternate constructions are contemplated, for example whereby immediately adjacent circuitry area 675 does not completely or partially encircle a capacitor array area 625.

FIGS. 2 and 3 depict an insulative material 12 having electrically conductive storage node pillars 14 formed therethrough in capacitor array area 625. Materials 12 and 14 may be fabricated over some suitable underlying material, for example bulk monocrystalline and/or underlying circuitry. Example insulative materials 12 include doped and undoped silicon dioxides, such as silicon dioxide deposited by the decomposition of tetraethylorthosilicate (TEOS) and/or borophosphosilicate glass (BPSG) and/or silicon nitride. Alternately by way of example, material 12 might comprise anisotropically etched insulative sidewall spacers, for example formed about transistor gate lines (not shown). An example material 14 is conductively doped polysilicon. Conductive material 14 can be considered as comprising or defining a plurality of capacitor storage node locations/contacts on substrate 10, and which have been designated with numerals 15, 16, 17, and 18 in FIGS. 2 and 3. Storage node contacts 15, 16, 17, and 18 are examples only and, regardless, may be conductive at this point in the process, or made conductive subsequently. Analogously, FIG. 4 depicts conductive node 22 relative to insulative material 12 within immediately adjacent circuitry area 675, and to which electrical connection is to be made. An etch stop layer 24, for example silicon nitride and/or undoped silicon dioxide, has been formed over materials 12 and 14 within areas 625 and 675. An example thickness is 275 Angstroms.

An insulating material 26 has been deposited over substrate 10 and then patterned to be removed from capacitor array area 625 and to have a first opening 27 within immediately adjacent circuitry area 675. Example materials are doped or undoped silicon dioxide deposited to an example thickness range from about 10,000 Angstroms to 14,000 Angstroms. Material 26 may extend to interface line 630.

Referring to FIGS. 5-7, a first material 28 has been deposited over capacitor array area 625 and within first opening 27 in immediately adjacent circuitry area 675. For example, such may be deposited to a suitable thickness to overfill first opening 27 and then be planarized back at least to the outermost surface of insulating material 26. Regardless, an example thickness for first material 28 is from about 10,000 Angstroms to about 14,000 Angstroms. Material 28 may or may not be partially or wholly sacrificial, with polysilicon, amorphous carbon, and transparent carbons being examples. In one embodiment, first material 28 does not extend laterally continuously from capacitor array area 625 into immediately adjacent circuitry area 675.

Referring to FIGS. 8 and 9, an inner insulative retaining material 30 has been deposited over first material 28 within capacitor array area 625 and over insulating material 26 and first material 28 within first opening 27 in immediately adjacent circuitry area 675. An example material is silicon nitride deposited to a thickness of from about 200 Angstroms to about 600 Angstroms. A second material 32 has been deposited over inner insulative retaining material 30 within array area 625 and circuitry area 675. Second material 32 may be insulative, and if so may be of different composition from inner insulative retaining material 30. In one embodiment, second material 32 may comprise doped or undoped silicon dioxide, and in one embodiment may be of the same composition as insulating material 26. An example thickness range for second material 32 is from about 6,000 Angstroms to about 10,000 Angstroms. In one embodiment, first material 28 is thicker than second material 32.

An outer insulative retaining material 34 has been deposited over second material 32 within array area 625 and circuitry area 675. Inner insulative retaining material 30 and outer insulative retaining material 34 may be of the same composition. Regardless, an example thickness range for outer insulative retaining material 34 is from about 200 Angstroms to about 600 Angstroms. Insulative retaining material as described herein may provide a supporting or retaining function during or after fabrication relative to capacitor electrodes as described above in the Background section, and as will be apparent from the continuing discussion. In one embodiment, inner and outer insulative retaining materials 30, 34 and second material 32 extend laterally continuously from array area 625 into circuitry area 675.

A hard-mask 36 has been formed over outer insulative retaining material 34 within array area 625 and circuitry area 675. In one embodiment, hard-mask 36 comprises sequentially deposited materials 37, 38, and 39. In one embodiment, material 37 is of the same composition as second material 32, material 38 is of the same composition as first material 28, and material 39 is of the same composition as outer insulative retaining material 34. Regardless and by way of examples only, an example thickness range for material 37 is from about 4,000 Angstroms to about 8,000 Angstroms, for material 38 from about 2,000 Angstroms to about 4,000 Angstroms, and for material 39 from about 200 Angstroms to about 800 Angstroms.

Figure 10:
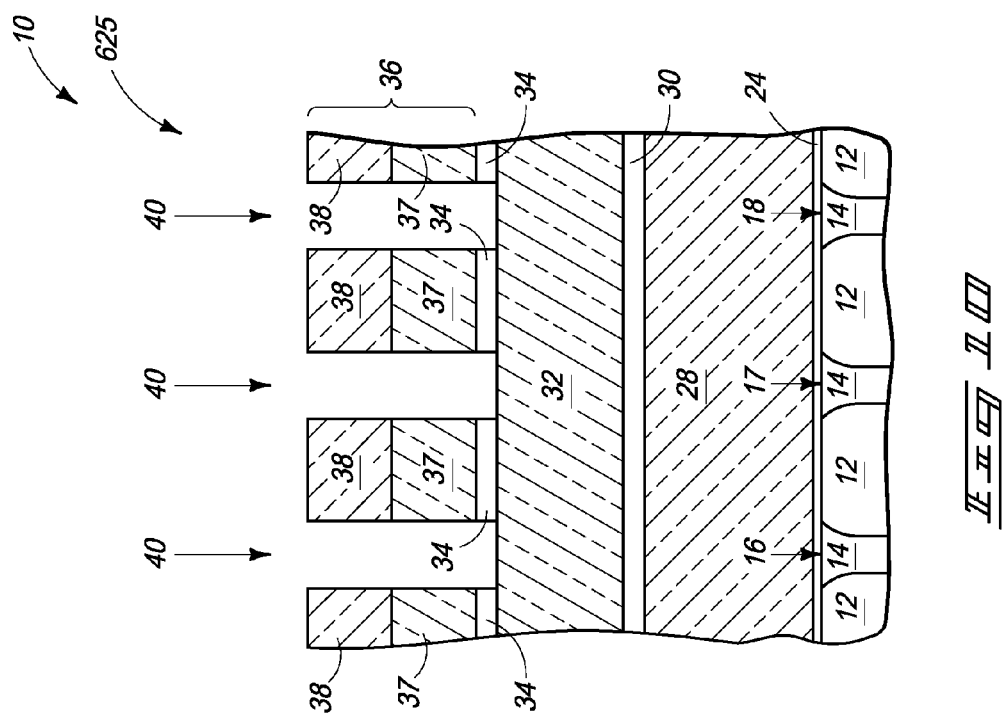
FIG. 10 is a view of the FIG. 8 substrate at a processing step subsequent to that shown by FIG. 8.

Referring to FIGS. 10 and 11, and in a common (single) masking step, a plurality of capacitor storage node openings 40 has been formed within array area 625 and a second opening 42 has been formed within circuitry area 675. In the depicted FIGS. 10 and 11 embodiments, openings 40 and 42 have been formed, for example, by etching through outer insulative retaining material 34, and material 39 (not shown) of hard-mask 36 has been removed. In one embodiment and as shown, second opening 42 overlaps at least some of first opening 27. Any suitable dry etching chemistries may be used in forming openings 40 and 42. For example, a $CF_4/O_2/N_2$ chemistry may be used to etch silicon nitride, an HBr based chemistry may be used to etch polysilicon, and a $CF_4$ based chemistry may be used to etch silicon dioxide.

Referring to FIGS. 12 and 13, capacitor storage node openings 40 and second opening 42 have been etched through second material 32 and inner insulative retaining material 30, and material 38 of hard-mask 36 has been thinned thereby. FIGS. 14-16 show capacitor storage node openings 40 and second openings 42 as having been extended through first material 28 within array area 625 and through first material 28 within first opening 27 in circuitry area 675, with material 38 (not shown) of hard-mask 36 having been removed, and material 37 thinned, in the process. Etch stop material 24 within capacitor storage node openings 40 and second openings 42 has also been removed.

Referring to FIGS. 17 and 18, conductive material 44 has been deposited within capacitor storage node openings 40 in array area 625 and within second openings 42 in circuitry area 675. Such may be any one or more of elemental metals, alloys of elemental metals, conductive metal compounds, and/or conductively doped semiconductive material. A specific example is TiN. In one embodiment and as shown, conductive material 44 is deposited to completely fill capacitor storage node openings 40 and to less than fill second openings 42, for example to form a sidewall lining within second openings 42. Alternately by way of example, conductive material 44 may be deposited to form respective sidewall linings within capacitor storage node openings 40 or be deposited to completely fill openings 42 in circuitry area 675.

Figure 20:
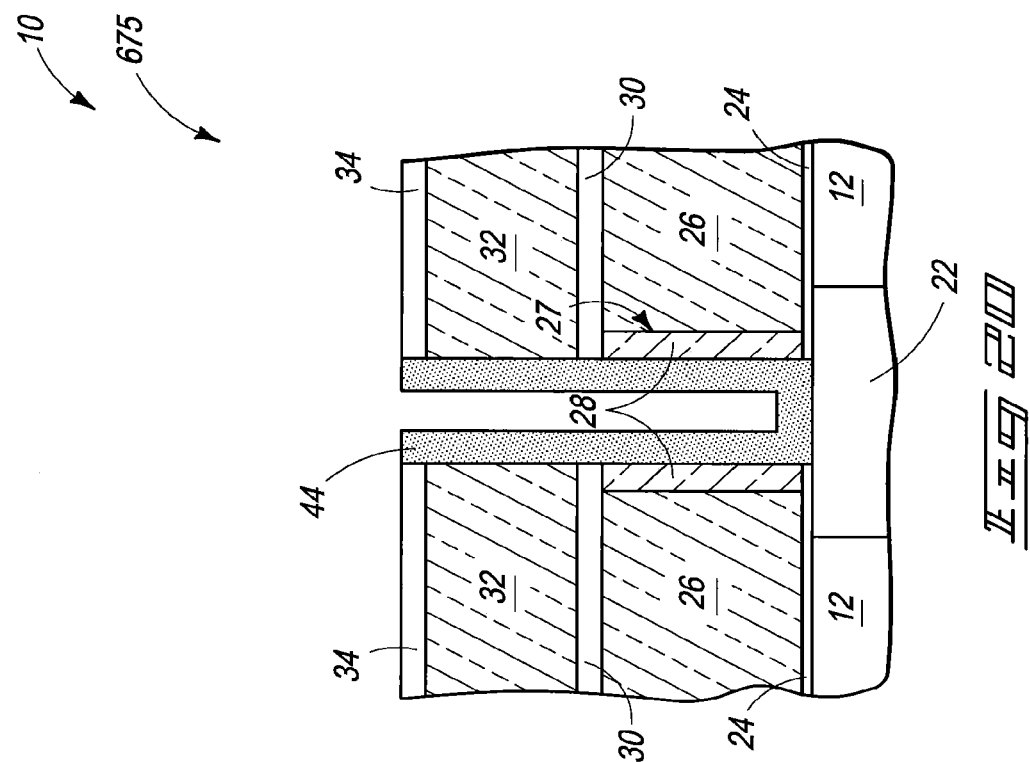
FIG. 20 is a view of the FIG. 18 substrate at a processing step subsequent to that shown by FIG. 18 and at the same processing sequence of FIG. 19.
Figure 19:
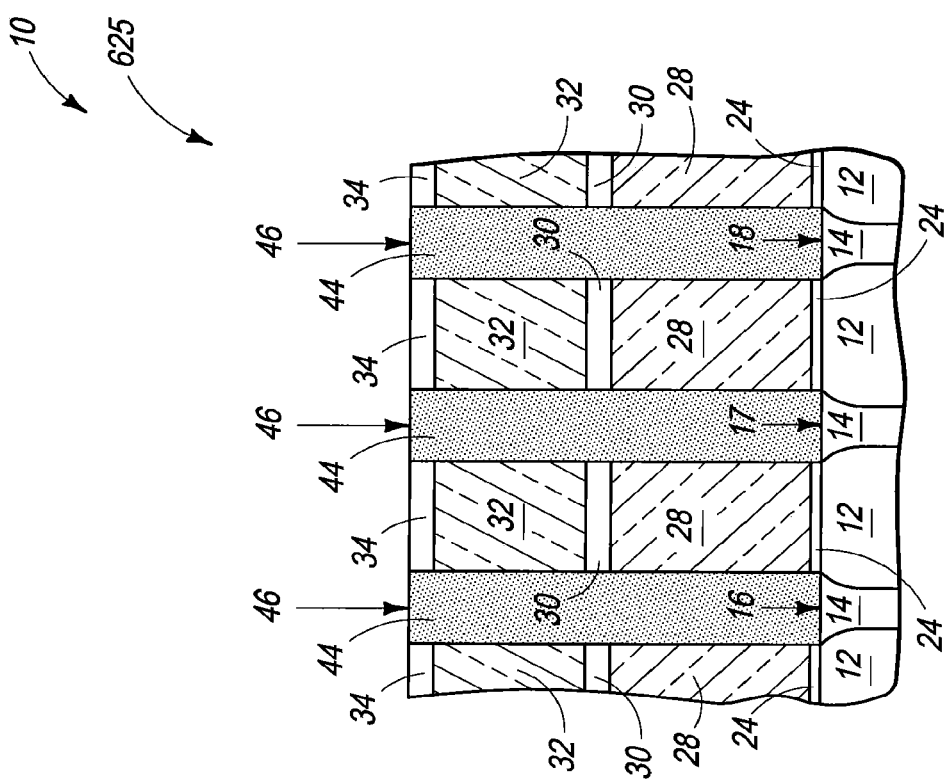
FIG. 19 is a view of the FIG. 17 substrate at a processing step subsequent to that shown by FIG. 17.

Referring to FIGS. 19 and 20, conductive material 44 has been planarized back at least to outer insulative retaining material 34. Conductive material 44 within capacitor array area 625 comprise respective capacitor electrodes 46 which will be incorporated into a plurality of capacitors.

The above processing provides but one example embodiment of providing a plurality of capacitor electrodes, inner and outer insulative retaining material received laterally about the capacitor electrodes, a first material received laterally about the capacitor electrodes inwardly of the inner insulative retaining material, and a second material received laterally about the capacitor electrodes elevationally between the inner and outer insulative retaining materials. Alternate methods might be used, and which may use more or fewer materials.

Figure 21:
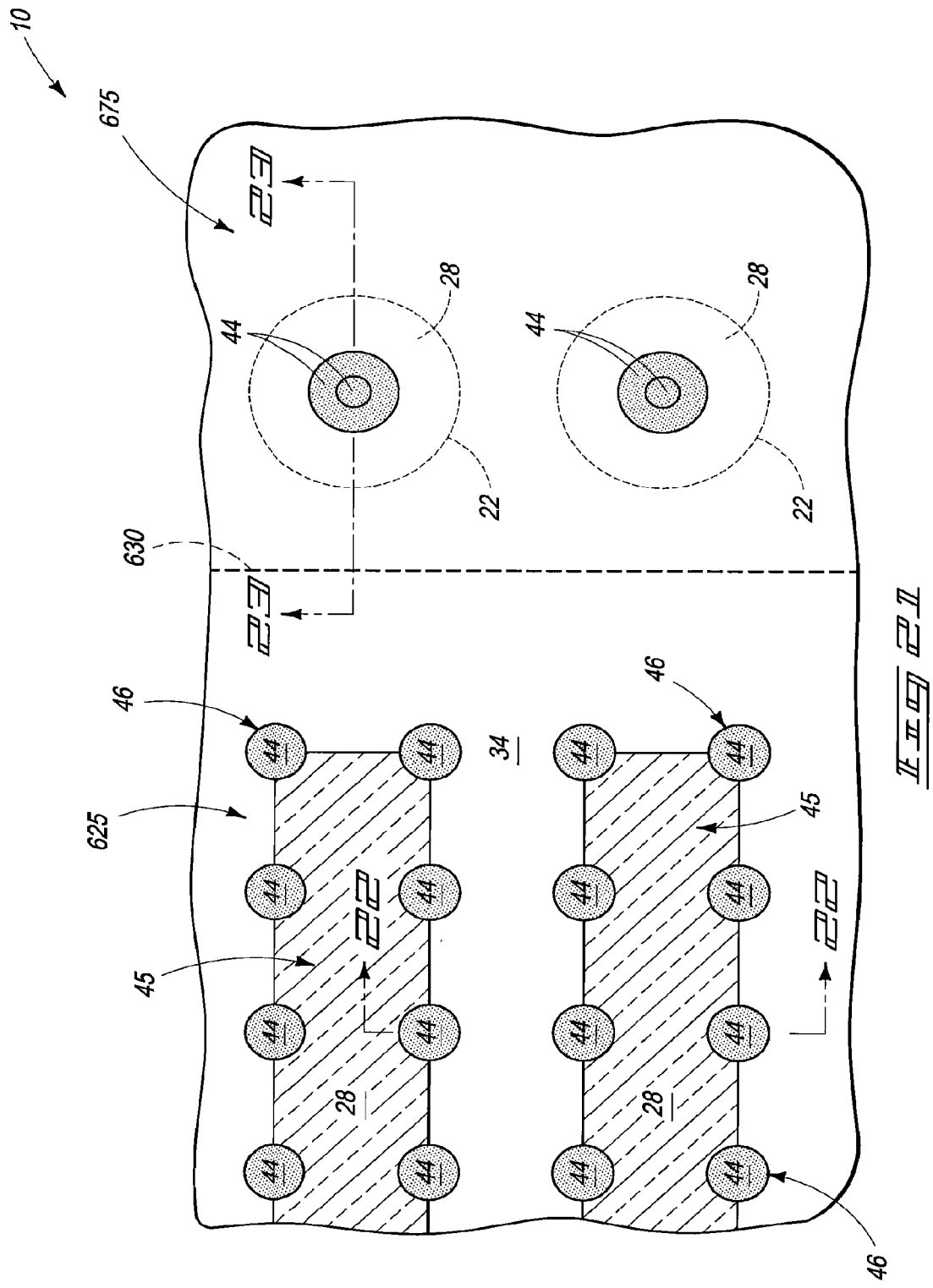
FIG. 21 is a diagrammatic top plan view of the substrate at a processing step subsequent to that shown by FIGS. 19 and 20.

Referring to FIGS. 21-23, openings 45 have been anisotropically etched to extend through outer insulative retaining material 34 and second material 32. In one embodiment and as shown, openings 45 are also anisotropically etched through inner insulative retaining material 30 to first material 28. Openings 45 provide access for liquid etchant to subsequently get to etch various materials within capacitor array area 625 underlying outer retaining material 34.

Figure 24:
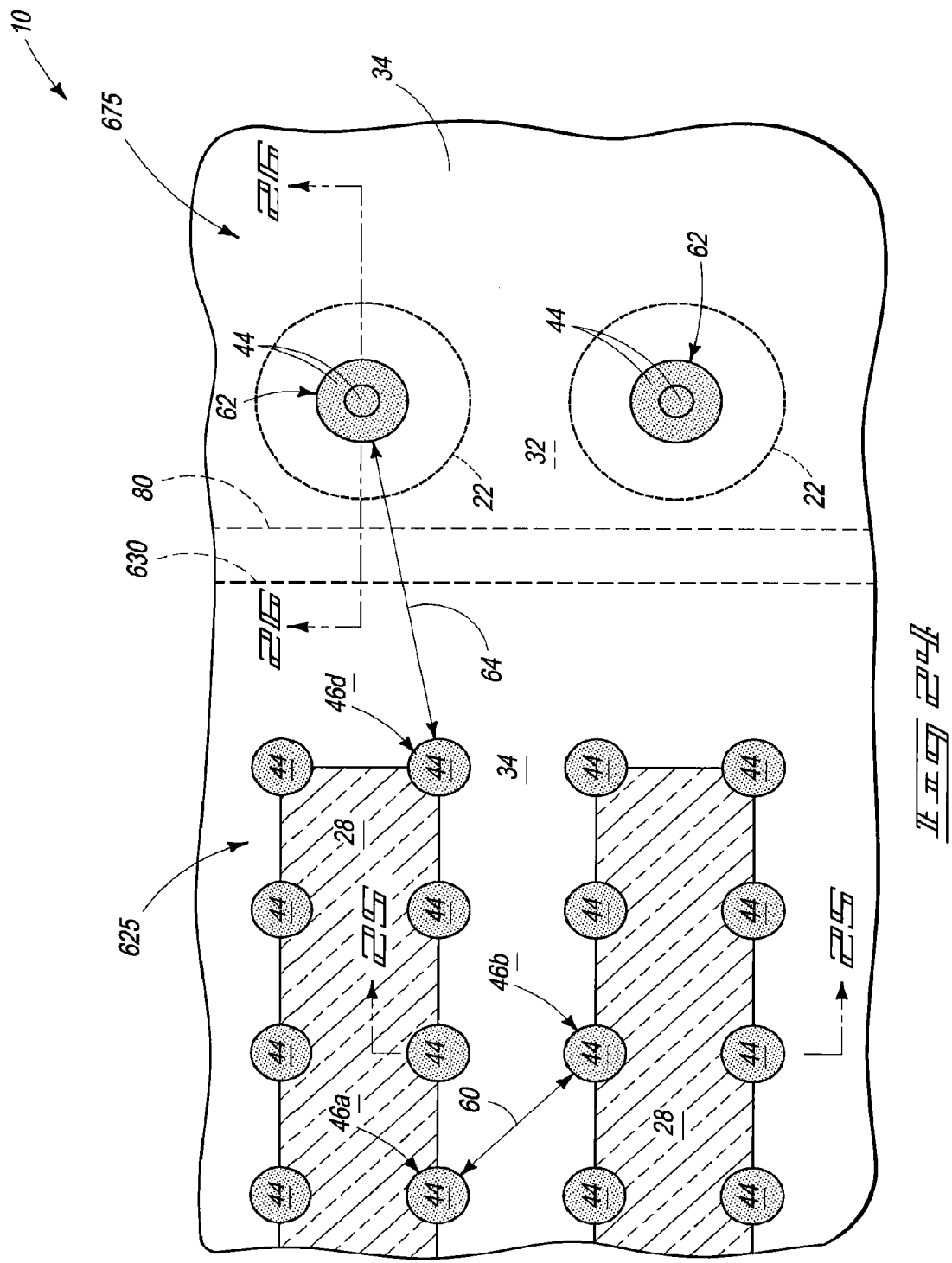
FIG. 24 is a diagrammatic top plan view of the FIG. 21 substrate at a processing step subsequent to that shown by FIG. 21.
Figure 26:
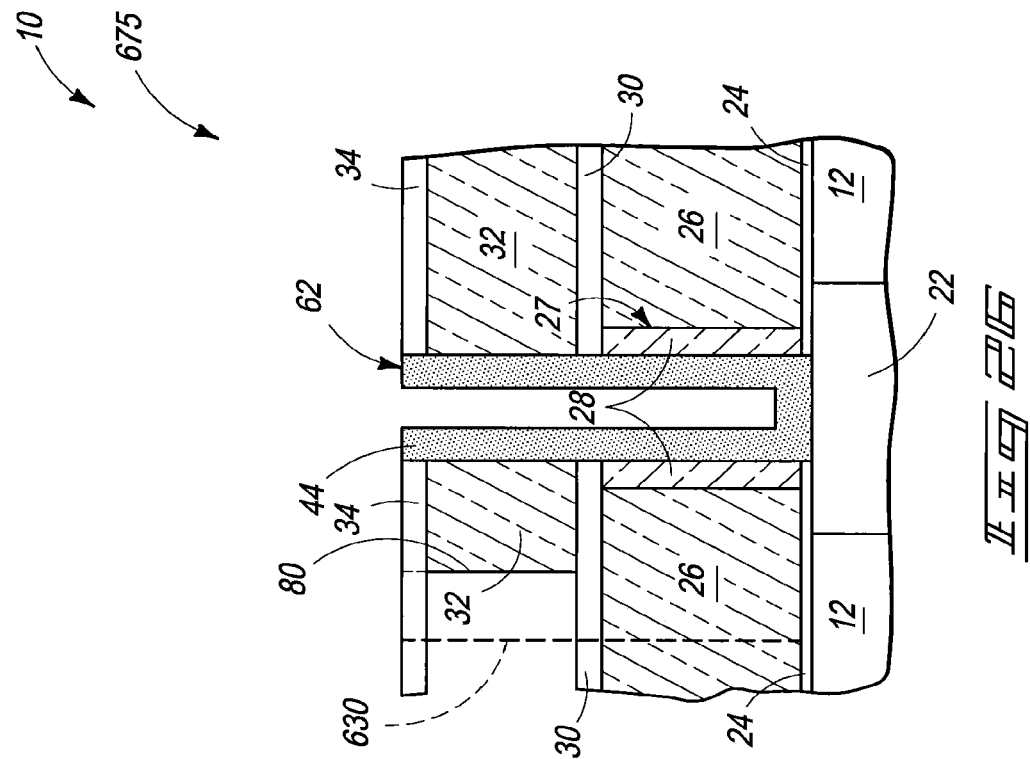
FIG. 26 is a section view through line 26-26 in FIG. 24.
Figure 25:
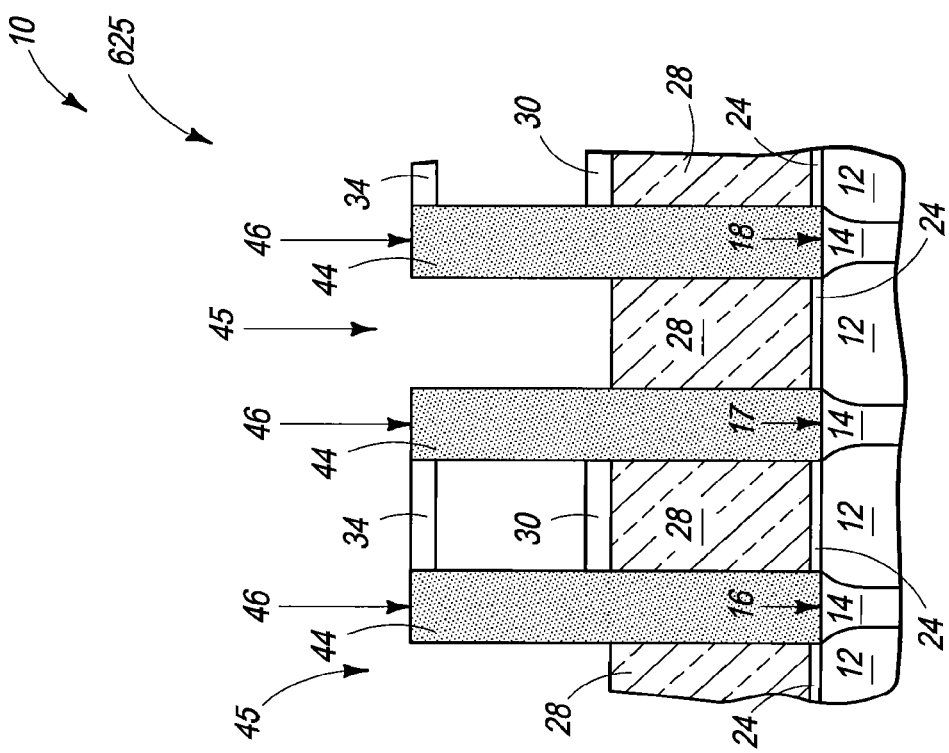
FIG. 25 is a section view through line 25-25 in FIG. 24.

Referring to FIGS. 24-26, remaining of second material 32 within array area 625 has been isotropically etched through openings 45 from being received laterally about capacitor electrodes 46 between elevationally inner and outer insulative retaining materials 30 and 34. Such isotropic etching has been conducted selectively at least relative to capacitor electrodes 46 and inner and outer insulative retaining materials 30 and 34. Where openings 45 extend through elevationally inner insulative retaining material 30, in one embodiment such isotropic etching may also be conducted selectively relative to first material 28. In the context of this document, a "selective" etch requires removal of one material relative to the other stated/exposed material(s) at a rate of at least 2:1. As an example where the retaining materials comprise silicon nitride, the conductive material comprises TiN, and first material 28 comprises polysilicon, an example highly selective isotropic etching chemistry for etching doped silicon dioxide as second material 32 is an HF-based etching solution and for undoped silicon dioxide a fluorocarbon chemistry.

In one embodiment and as shown, substrate 10 is void of any separating trench that is elevationally coincident with the capacitor electrodes between capacitor array area 625 and immediately adjacent circuitry area 675. Alternately, such a separating trench may be used, for example as shown in certain embodiments in U.S. Pat. Nos. 7,125,781; 7,387,939; 7,557,013; 7,682,924; and U.S. Patent Application Publication Nos. 2008/0090416 and 2008/0206950.

In one embodiment, immediately adjacent pairs of capacitor electrodes have some first maximum spacing there-between, and adjacent circuitry area 675 comprises some conductive structure which is closest to an immediately adjacent one of the capacitor electrodes at a second minimum spacing. For example referring to FIG. 24, capacitor electrodes 46a and 46b are an immediately adjacent pair of capacitor electrodes having a first maximum spacing 60 there-between. In the context of this document, an "immediately adjacent capacitor electrode" is any of a plurality of immediately surrounding capacitor electrodes. Accordingly in FIG. 24, each capacitor electrode has eight surrounding capacitor electrodes, with the diagonal spacing 60 between example capacitor electrodes 46a and 46b being the maximum spacing.

Conversely, adjacent circuitry area 675 comprises an example conductive structure 62 which is closest to an immediately adjacent capacitor electrode 46d at a second minimum spacing 64. In one embodiment, second minimum spacing 64 is greater than first maximum spacing 60, and in one embodiment is at least two times greater than first maximum spacing 60. In one embodiment, the isotropic etching of second material 32 is conducted as a timed isotropic etch through openings 45 within capacitor array area 625 which is long enough to remove all remaining second material 32 received along first maximum spacing 60, and yet is short enough to leave some second material 32 between conductive structure 62 and closest capacitor electrode 46d along second minimum spacing 64. For example in FIG. 24, consider that the isotropic etching of second material 32 through openings 45 will etch such material laterally outward to the right toward immediately adjacent circuitry area 675. Accordingly, there will be an example left-most edge 80 of material 32 that continues to move towards the right as a timed etch progresses, in one embodiment. If the etching in such embodiment were allowed to progress sufficiently long wherein left-most edge 80 of second material 32 moves to the right to the point of exposing conductive structure 62, subsequent processing may lead to shorting or other adverse aspects with respect to conductive components within circuitry area 675. Where second minimum spacing 64 is greater than first maximum spacing 60, a timed etch may be conducted long enough to clear all second material from being received anywhere along maximum spacing 60 while leaving some second material along minimum spacing 64, thereby potentially avoiding shorting or other adverse phenomena. The isotropic etching may be conducted such that left-most edge 80 is within array area 625, within circuitry area 675 (as shown), or is coincident with interface line 630.

Figure 27:
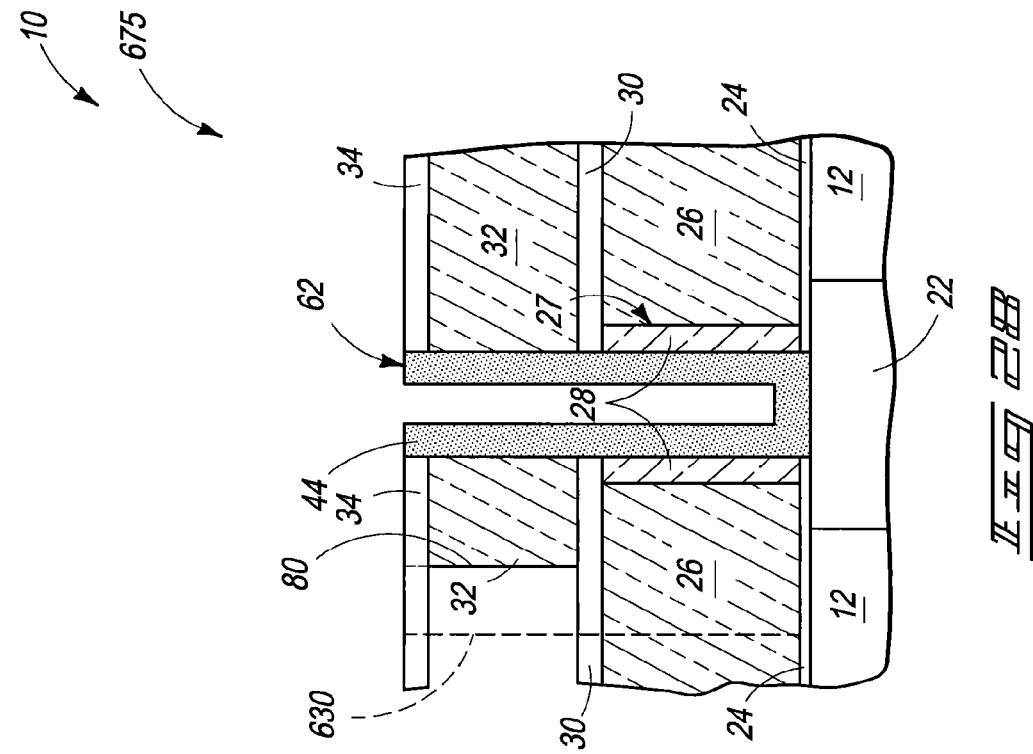
FIG. 27 is a view of the FIG. 25 substrate at a processing step subsequent to that shown by FIG. 25.
Figure 28:
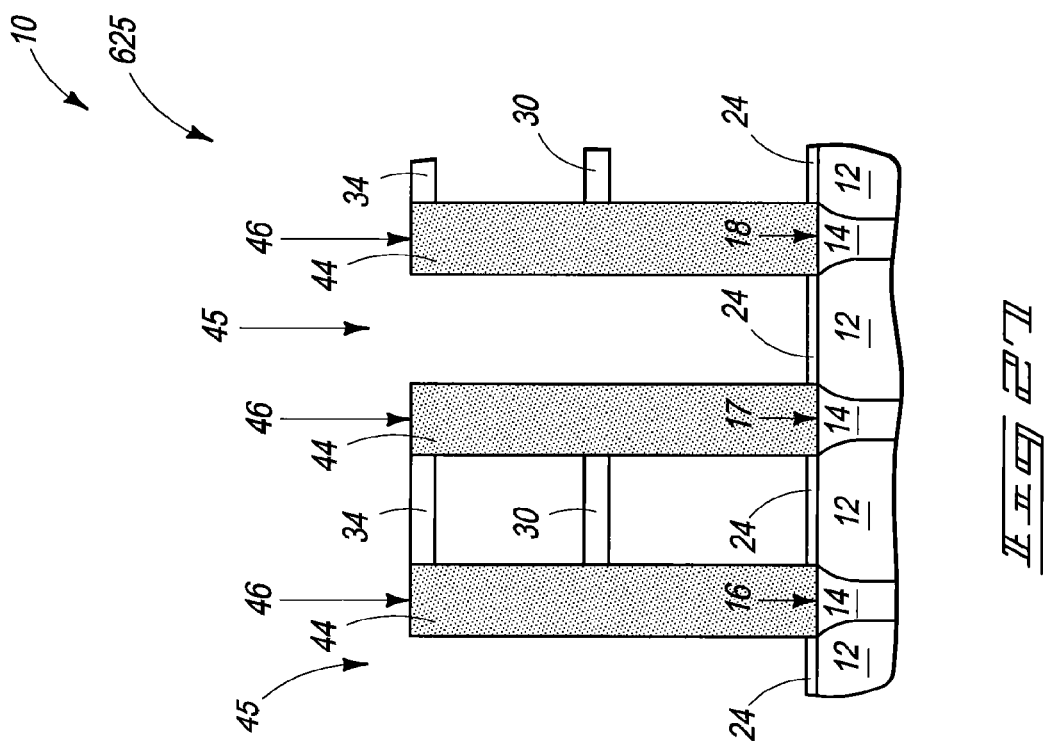
FIG. 28 is a view of the FIG. 26 substrate at a processing step subsequent to that shown by FIG. 26 and at the same processing sequence of FIG. 27.

Referring to FIGS. 27 and 28, first material 28 (not shown in area 625) has been isotropically etched through openings 45 selectively relative to conductive material 44 of capacitor electrodes 46, inner and outer insulative retaining materials 30, 34, and insulating material 26. A suitable wet isotropic etching chemistry comprises an aqueous tetramethylammonium hydroxide solution with respect to the above materials where first material 28 is polysilicon.

Figure 29:
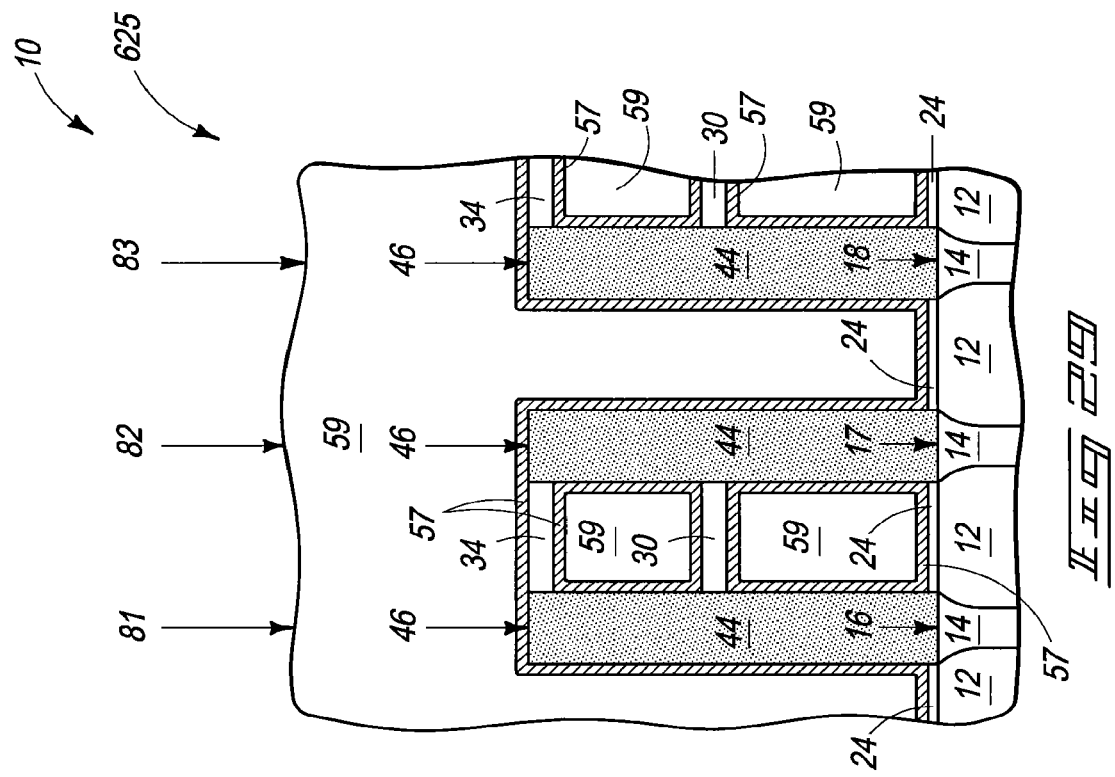
FIG. 29 is a view of the FIG. 27 substrate at a processing step subsequent to that shown by FIG. 27.

Capacitor electrodes 46 are incorporated into a plurality of capacitors. For example, FIG. 29 depicts deposition of a capacitor dielectric 57. Example materials include is a silicon dioxide/silicon nitride/silicon dioxide composite, or any suitable Hi-k dielectric, whether existing or yet-to-be developed. By way of example only, Hi-k dielectrics include $Ta_2O_5$ and barium strontium titanate.

An outer capacitor electrode material 59 has been deposited over capacitor dielectric 57, thereby defining capacitors 81, 82 and 83. Such are depicted as comprising a common capacitor cell plate to all of the depicted capacitors, for example as might be utilized in DRAM or other circuitry. For example, FIG. 30 depicts an example DRAM cell incorporating capacitor 81. Such comprises an example transistor gate word line 87 having insulative sidewall spacers, an insulative cap, a conductive region under the cap such as a silicide, a conductive polysilicon region under the silicide, and a gate dielectric region under the polysilicon. Source/drain regions 79 are shown formed within a semiconductive material 90 operatively proximate word line 87. One of source/drain regions 79 electrically connects with capacitor 81, and another of such electrically connects with a data/sense line 85.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a plurality of capacitors, comprising:
    forming a plurality of capacitor electrodes, an elevationally inner material laterally about the capacitor electrodes, an elevationally outer material laterally about the capacitor electrodes, a first material laterally about the capacitor electrodes elevationally inward of the inner material, a second material laterally about the capacitor electrodes elevationally between the inner and outer materials;
    forming openings to extend through the outer material and the second material;
    after forming the openings, removing all remaining of the second material through the openings from being laterally about the capacitor electrodes between the inner and outer materials, the removing of the second material being conducted selectively relative to the capacitor electrodes and the inner and outer materials;
    after removing all remaining of the second material through the openings from being laterally about the capacitor electrodes between the inner and outer materials, removing all remaining of the first material through the openings from being laterally about the capacitor electrodes between the inner and outer materials; and
    incorporating the capacitor electrodes into a plurality of capacitors.

2. The method of claim 1 wherein the inner material and the outer material are of the same composition.

3. The method of claim 1 wherein the first material comprises polysilicon.

4. The method of claim 1 wherein the second material comprises an insulator.

5. The method of claim 1 wherein the removing of the first material is conducted selectively relative to the inner and outer materials.

6. The method of claim 5 wherein the inner and outer materials are laterally about the capacitor electrodes in a finished circuitry construction comprising the plurality of capacitors.

7. The method of claim 1 wherein the inner and outer materials are laterally about the capacitor electrodes in a finished circuitry construction comprising the plurality of capacitors.

8. The method of claim 1 wherein the second material is thicker than each of the inner material and the outer material.

9. A method of forming a plurality of capacitors, comprising:
    forming a plurality of capacitor electrodes, an elevationally inner material laterally about the capacitor electrodes, an elevationally outer material laterally about the capacitor electrodes, a first material laterally about the capacitor electrodes elevationally inward of the inner material, a second material laterally about the capacitor electrodes elevationally between the inner and outer materials, the first and second materials being of different compositions, the first material comprising polysilicon, the second material comprising an insulator;
    forming openings to extend through the outer material and the second material;
    after forming the openings, removing remaining of the second material through the openings from being laterally about the capacitor electrodes between the inner and outer materials, the removing of the second material being conducted selectively relative to the capacitor electrodes and the inner and outer materials;
    removing all remaining of the first material through the openings from being laterally about the capacitor electrodes between the inner and outer materials; and
    incorporating the capacitor electrodes into a plurality of capacitors.

10. A method of forming a plurality of capacitors, comprising:
    forming a plurality of capacitor electrodes, an elevationally inner material laterally about the capacitor electrodes, an elevationally outer material laterally about the capacitor electrodes, a first material laterally about the capacitor electrodes elevationally inward of the inner material, a second material laterally about the capacitor electrodes elevationally between the inner and outer materials;
    forming openings to extend through the outer material and the second material,
    the openings being formed through the inner material to the first material;
    after forming the openings, removing remaining of the second material through the openings from being laterally about the capacitor electrodes between the inner and outer materials, the removing of the second material being conducted selectively relative to the capacitor electrodes and the inner and outer materials; and incorporating the capacitor electrodes into a plurality of capacitors.

11. The method of claim 10 wherein the first and second materials are of different compositions, the removing of the second material being conducted selectively relative to first material.

12. The method of claim 11 comprising after removing the second material, removing the first material through the openings selectively relative to the capacitor electrodes and the inner and outer materials.

13. A method of forming a plurality of capacitors, comprising:

forming a plurality of capacitor electrodes, an elevationally inner material laterally about the capacitor electrodes, an elevationally outer material laterally about the capacitor electrodes, a first material laterally about the capacitor electrodes elevationally inward of the inner material, a second material laterally about the capacitor electrodes elevationally between the inner and outer materials;

forming openings to extend through the outer material and the second material;

after forming the openings, removing remaining of the second material through the openings from being laterally about the capacitor electrodes between the inner and outer materials, the removing of the second material being conducted selectively relative to the capacitor electrodes and the inner and outer materials; and incorporating the capacitor electrodes into a plurality of capacitors, the plurality of capacitor electrodes being fabricated within a capacitor array area, the substrate comprising a circuitry area immediately adjacent the capacitor array area, the substrate being void of a separating trench that is elevationally coincident with the capacitor electrodes between said capacitor array area and said immediately adjacent circuitry area.

14. A method of forming a plurality of capacitors, comprising:

forming a substrate comprising a capacitor array area and a circuitry area immediately adjacent the capacitor array area, the capacitor array area comprising a plurality of capacitor electrodes, immediately adjacent pairs of capacitor electrodes having a first maximum spacing there-between, the immediately adjacent circuitry area comprising a conductive structure which is closest to an immediately adjacent one of the capacitor electrodes at a second minimum spacing, the second minimum spacing being greater than the first maximum spacing;

an etchable material being laterally about the capacitor electrodes and that extends laterally continuously from the capacitor array area into said immediately adjacent circuitry area, a covering material elevationally over the etchable material in the immediately adjacent area;

conducting a timed isotropic etch within the capacitor array area which is long enough to remove all remaining of the etchable material along said first maximum spacing between said immediately adjacent pairs of capacitor electrodes and which is short enough to leave some etchable material between said conductive structure and said closest capacitor electrode along said second minimum spacing, the timed isotropic etching of the second material being conducted selectively relative to the covering material; and incorporating the capacitor electrodes into a plurality of capacitors.

15. The method of claim 14 wherein the etchable material extends to contact the conductive structure.

16. The method of claim 14 wherein the covering material is over the capacitor array area, and comprising forming an opening through the covering material prior to conducting the timed isotropic etch.

17. The method of claim 16 comprising forming multiple openings through the covering material prior to conducting the timed isotropic etch.

18. The method of claim 14 wherein the second minimum spacing is at least two times greater than the first maximum spacing.

19. A method of forming a plurality of capacitors, comprising:

providing a substrate comprising a capacitor array area and a circuitry area immediately adjacent the capacitor array area, the capacitor array area comprising a plurality of capacitor electrodes, an elevationally inner material laterally about the capacitor electrodes, an elevationally outer material laterally about the capacitor electrodes, a first material laterally about the capacitor electrodes elevationally inward of the inner material, a second material laterally about the capacitor electrodes elevationally between the inner and outer materials, the inner and outer materials and the second material extending laterally continuously from the capacitor array area into said immediately adjacent circuitry area, immediately adjacent pairs of capacitor electrodes having a first maximum spacing there-between, the immediately adjacent circuitry area comprising a conductive structure which is closest to an immediately adjacent one of the capacitor electrodes at a second minimum spacing, the second minimum spacing being greater than the first maximum spacing;

forming openings within the capacitor array area to extend through the outer material and the second material;

after forming the openings, conducting a timed isotropic etch through the openings within the capacitor array area which is long enough to remove all remaining second material along said first maximum spacing between said immediately adjacent pairs of capacitor electrodes and which is short enough to leave some second material between said conductive structure and said closest capacitor electrode along said second minimum spacing, the timed isotropic etching of the second material being conducted selectively relative to the capacitor electrodes and the inner and outer materials; and incorporating the capacitor electrodes into a plurality of capacitors.

20. The method of claim 19 wherein the second minimum spacing is at least two times greater than the first maximum spacing.

21. A method of forming a plurality of capacitors, comprising:

providing a substrate comprising a capacitor array area and a circuitry area immediately adjacent the capacitor array area, the immediately adjacent circuitry area having a first opening received within a surrounding material;

depositing a fill material over the capacitor array area and within the first opening in the immediately adjacent circuitry area;

depositing covering material over the first material within the capacitor array area and over the surrounding material and fill material within the first opening in the immediately adjacent circuitry area;

in a common masking step, forming a plurality of capacitor storage node openings in the covering material within the capacitor array area and forming a second opening in the covering material within the immediately adjacent circuitry area, the second opening overlapping at least some of the first opening;

depositing conductive material within the capacitor storage node openings in the capacitor array area and within the second opening in the immediately adjacent circuitry area; and incorporating the conductive material within the capacitor array area into a plurality of capacitors.

22. The method of claim 21 wherein the conductive material is deposited to completely fill the capacitor storage node openings and to less than fill the second opening.

23. The method of claim 22 wherein the conductive material is deposited to form a sidewall lining within the second opening.

24. The method of claim 21 wherein the conductive material is deposited to completely fill the capacitor storage node openings and to completely fill the second opening.

25. The method of claim 21 wherein the conductive material is deposited to less than fill the capacitor storage node openings and less than fill the second opening.

26. The method of claim 21 wherein the second opening is fully laterally overlapping of the first opening.

27. The method of claim 26 wherein the second opening is fully laterally surrounded by the first opening.

28. The method of claim 21 wherein the second opening is formed to extend into the fill material that is within the first opening.

29. The method of claim 28 wherein the second opening is formed to extend through the fill material that is within the first opening.

30. The method of claim 28 wherein the second opening is laterally surrounded by the fill material.

31. The method of claim 30 wherein the second opening is formed to extend through the fill material that is within the first opening.

* * * * *